United States Patent
Song et al.

(10) Patent No.: US 8,495,458 B1
(45) Date of Patent: *Jul. 23, 2013

(54) SYSTEMS AND METHODS FOR MULTISTAGE ERROR CORRECTION

(75) Inventors: Shumei Song, Santa Clara, CA (US); Xueshi Yang, Cupertino, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 695 days.

This patent is subject to a terminal disclaimer.

(21) Appl. No.: 12/619,353

(22) Filed: Nov. 16, 2009

Related U.S. Application Data

(63) Continuation-in-part of application No. 12/543,006, filed on Aug. 18, 2009.

(60) Provisional application No. 61/122,010, filed on Dec. 12, 2008, provisional application No. 61/115,331, filed on Nov. 17, 2008.

(51) Int. Cl.
*G06F 11/00* (2006.01)

(52) U.S. Cl.
USPC .................................. 714/758; 714/759

(58) Field of Classification Search
USPC .............................. 714/752, 758, 759
See application file for complete search history.

(56) References Cited

U.S. PATENT DOCUMENTS

| | | | |
|---|---|---|---|
| 5,875,280 A | 2/1999 | Takaiwa et al. | |
| 6,516,136 B1 * | 2/2003 | Lee | 386/353 |
| 7,076,721 B2 * | 7/2006 | Sawaguchi | 714/755 |
| 7,571,372 B1 * | 8/2009 | Burd et al. | 714/769 |
| 7,787,205 B2 * | 8/2010 | Kuznetsov et al. | 360/53 |
| 7,840,882 B2 * | 11/2010 | Lee et al. | 714/784 |
| 7,865,799 B2 * | 1/2011 | Sawaguchi | 714/755 |
| 7,934,143 B1 * | 4/2011 | Wu et al. | 714/769 |
| 8,032,812 B1 * | 10/2011 | Yang et al. | 714/755 |
| 8,181,084 B1 * | 5/2012 | Chaichanavong et al. | 714/758 |
| 8,230,312 B1 * | 7/2012 | Yeo et al. | 714/795 |
| 8,307,268 B2 * | 11/2012 | Chaichanavong et al. | 714/795 |
| 2004/0194005 A1 | 9/2004 | Huggett | |
| 2005/0193282 A1 | 9/2005 | Lee | |
| 2006/0083336 A1 | 4/2006 | Zhang et al. | |
| 2006/0109935 A1 | 5/2006 | McQueen et al. | |
| 2007/0043997 A1 * | 2/2007 | Yang et al. | 714/758 |
| 2007/0186137 A1 * | 8/2007 | Choi et al. | 714/753 |
| 2009/0150746 A1 * | 6/2009 | Chaichanavong et al. | 714/752 |

* cited by examiner

*Primary Examiner* — Bryce Bonzo
*Assistant Examiner* — Elmira Mehrmanesh

(57) ABSTRACT

In one embodiment, the present invention includes an error correction method. The error correction method comprises receiving a digital signal and processing the digital signal to perform a first error correction. The first error correction includes a first correction for data insertions or deletions and a first correction of data errors to generate a reference signal. The reference signal corresponds to the digital signal having been corrected to a first correction accuracy. The digital signal and the reference signal may be processed to perform a second correction for data insertions or deletions to generate a synchronized signal. The second correction of the digital signal is based on the reference signal, and the correction accuracy of the second correction is more accurate than the first correction accuracy.

20 Claims, 16 Drawing Sheets

SYSTEMS AND METHODS FOR MULTISTAGE ERROR CORRECTION

CROSS REFERENCE TO RELATED APPLICATIONS

This application claims the benefit of priority from U.S. Provisional Application No. 61/122,010, filed Dec. 12, 2008, entitled "Description for the Data Synchronizer in Multistage Insertion/Deletion Detection", the entirety of which is hereby incorporated herein by reference. This application claims the benefit of priority from U.S. Provisional Application No. 61/115,331, filed Nov. 17, 2008, entitled "Iterative Insertion/Deletion Detection and Coding Scheme." This application is a continuation-in-part of, and claims the benefit of priority from, U.S. patent application Ser. No. 12/543,006, filed Aug. 18, 2009, entitled "Systems and Methods for Multistage Error Correction."

BACKGROUND

The present invention relates to data correction, and in particular, to systems and methods for multistage error correction.

Some communication channels, such as bit patterned recording, suffer from bit insertions and deletions in addition to substitution errors due to loss of synchronization during write or read operations. As used herein, the term "bit insertion/deletion" refers to data values inserted or deleted in a bipolar data stream (+1/−1 or 1/0), which may be a single bit, or sampled data values inserted or deleted in a sampled data stream, where a "bit" insertion/deletion includes insertion or deletion of one bit or multiple bits representing a sample data value.

FIG. 1 illustrates bit insertion and deletion errors due to loss of synchronization during a write operation. FIG. 1 includes scenarios 100-102. Scenario 100 shows an example of bit insertion due to write clock period Tc that is greater than bit-island period Tb. Clock signal 104 has a period Tc which causes an insertion of data bit 3b along side data bit 3a for bit islands 103. Scenario 101 shows an example of a synchronized clock signal 106 that corresponds to having no insertions or deletions for bit islands 105. Clock signal 106 is synchronized with bit islands 105. Scenario 102 shows an example of bit deletion due to write clock signal 108 having a period Tc that is less than bit-island period Tb. The result of the smaller period Tc is a deletion of bit-island 4 of the bit islands 107.

FIG. 2 illustrates an example of a traditional magnetic media 200 and a magnetic bit pattern media 201 used for recording digital data. Magnetic media 200 includes three tracks 203. A track 204 includes a continuous magnetic signature 202 which may be read back and translated into a stream of digital data. Magnetic media 201 has three tracks 207 which are more densely compacted than magnetic media 200. Each of the tracks 207 has a plurality of magnetic islands. Data in a bit pattern media is represented as a pattern of magnetic islands. For instance, magnetic island 205 represents a negative polarized magnetic area, and may be surrounded by other magnetic islands and separated by a space 206 between the islands. Although the bit pattern media 201 may have more densely packed data, the read back data may contain bit insertions and deletions which may cause errors in data synchronization.

Errors in data synchronization may prevent the use of conventional forward error correction (FEC) coding that would benefit from accurate synchronization. In some cases, redundancy may improve the ability to perform error correction, but the more redundant a coding scheme the less dense the actual user data. Current correction schemes, designed for correcting insertions/deletions and substitution errors, typically have low code rate which may be undesirable for many applications.

Thus, it is desirable to improve data correction. The present invention solves these and other problems by providing systems and methods for multistage error correction.

SUMMARY

Embodiments of the present invention improve data correction. An error correction method comprises receiving a digital signal, processing the digital signal to perform a first error correction, the first error correction including a first correction for data insertions or deletions and a first correction of data errors to generate a reference signal, and processing the digital signal and the reference signal to perform a second correction for data insertions or deletions to generate a synchronized signal, wherein the second correction of the digital signal is based on the reference signal.

In one embodiment, the first correction of data errors comprises decoding using a first error correction code.

In one embodiment, the error correction method further comprises a second correction of data errors, the second correction comprising decoding the synchronized signal using a second error correction code.

In one embodiment, processing the digital signal and the reference signal to perform a second correction comprises comparing the reference signal to the digital signal to determine a number of data insertions or deletions, and if one or more data insertions are detected, deleting a number of data bits equal to the number of insertions, and if one or more deletions are detected, inserting a number of data bits equal to the number of deletions.

In one embodiment, processing the digital signal and the reference signal to perform a second correction comprises determining a location for each insertion or deletion and erasing data bits around the location for each insertion or deletion.

In one embodiment, the comparing is performed using a linear programming algorithm.

In one embodiment, the reference signal corresponds to the digital signal having been corrected to a first correction accuracy, and wherein the correction accuracy of the second correction is more accurate than the first correction accuracy.

In one embodiment, processing the digital signal to perform the first correction comprises detecting the number of insertions or deletions in a segment of the digital signal, determining an approximate location of the detected insertions or deletions in the segment, erasing bits in the digital signal around the approximate location to produce a synchronized erased signal, and decoding the synchronized erased signal using an error correction code to produce the reference signal.

In one embodiment, the digital signal comprises a sampled digital signal, the method further comprising converting the sampled digital signal to a bipolar data signal using a linear programming algorithm.

In one embodiment, the linear programming algorithm is a Viterbi algorithm, and a first Viterbi algorithm is executed before the first correction of data errors and wherein a second Viterbi algorithm is executed on the synchronized signal before a second correction of data errors.

In another embodiment, the present invention includes an error correction system comprising a first error correction stage to receive a digital signal, the first error correction stage configured to perform a first error correction including a first correction for data insertions or deletions and a first correction of data errors to generate a reference signal, and a data synchronization stage to receive the digital signal and the first reference signal, the data synchronization stage configured to perform a second correction for data insertions or deletions to generate a synchronized signal, wherein the second correction of the digital signal is based on the reference signal.

In one embodiment, the first correction stage comprises a first decoder for performing the first correction of data errors using a first error correction code.

In one embodiment, the error correction system further comprises a second decoder coupled to an output of the data synchronization stage to correct of data errors in the synchronized signal using a second error correction code, and the first and second error correction codes are the same.

In one embodiment, the data synchronization stage compares the reference signal to the digital signal to determine a number of data insertions or deletions and a location for each insertion or deletion.

In one embodiment, the data synchronization stage further comprises a bit correction and erasing stage, wherein if one or more data insertions are detected, a number of data bits equal to the number of insertions are deleted at the location, and if one or more deletions are detected, a number of data bits equal to the number of deletions are inserted at the location, the bit correction and erasing stage further erasing bits around the location of each insertion or deletion.

In one embodiment, the first error correction stage comprises a detector having an input coupled to receive the digital signal and produce a detected number of insertions or deletions in a segment of the digital signal and a detected location of the detected insertions or deletions in the segment, a digital processor having a first input coupled to receive the digital signal and a second input coupled to an output of the detector, the digital processor erasing bits in the digital signal around the detected location to produce a synchronized erased signal, and a decoder coupled to receive the synchronized erased signal, the decoder using an error correction code to correct data errors in the synchronized erased signal to produce the first reference signal.

In one embodiment, the digital signal comprises a sampled digital signal. The sampled digital signal may be converted to a bipolar data signal using a linear programming algorithm. The linear programming algorithm may be a Viterbi algorithm, where a first Viterbi algorithm is executed before the first correction of data errors, and where the synchronization stage is coupled to a second linear programming stage to execute a second Viterbi algorithm on the synchronized signal before a second correction of data errors.

In one embodiment, the reference signal corresponds to the digital signal having been corrected to a first correction accuracy, and wherein the correction accuracy of the second correction is more accurate than the first correction accuracy.

In another embodiment, the present invention includes an error correction method comprising receiving a digital signal, processing the digital signal in a first error correction stage to perform a first error correction and to generate a reference signal, and processing the digital signal in a plurality of subsequent error correction stages to perform additional corrections for data insertions or deletions and data errors to generate a plurality of subsequent reference signals. The first error correction includes a first correction for data insertions or deletions and a first correction of data errors. Each subsequent error correction stage performs the additional correction for the data insertions or deletions based on the digital signal and a previous reference signal from a previous error correction stage.

In one embodiment, different error correction stages use different correction algorithms to correct for the data insertions or deletions.

In one embodiment, at least one error correction stage uses a soft channel detector to correct for the data insertions or deletions and at least one other stage uses a hard channel detector correct for the data insertions or deletions.

In one embodiment, one or more reference signals correspond to the digital signal having been corrected.

In one embodiment, at least one reference signal comprises log likelihood ratios.

In one embodiment, at least one reference signal is a difference signal, and wherein the difference signal is generated by subtracting an input to a soft ECC decoder from an output of the soft ECC decoder. In one embodiment, the difference signal comprises extrinsic information.

In one embodiment, at least one error correction stage performs processing comprising detecting a number and location of the insertions or deletions in the digital signal, synchronizing the digital signal using the detected number and location of insertions or deletions to generate a synchronized signal, processing the synchronized signal using a first hard channel detector to generate a first binary signal, and processing the first binary signal in a hard ECC decoder to generate one of said reference signals. An error correction stage subsequent to said at least one error correction stage performs processing comprising processing the digital signal with a second hard channel detector to generate a second binary signal and detecting a number and location of insertions or deletions in the second binary signal using said one of said reference signals from the previous stage.

In one embodiment, the first hard channel detector is a Viterbi channel detector.

In one embodiment, at least one error correction stage performs processing comprising detecting a number and location of the insertions or deletions in the digital signal, synchronizing the digital signal using the detected number and location of insertions or deletions to generate a synchronized signal, processing the synchronized signal using a first soft channel detector to generate a first signal, and processing the first signal in a soft ECC decoder to generate one of said reference signals. An error correction stage subsequent to said at least one error correction stage performs processing comprising processing the digital signal and said one of said reference signals from the previous stage with a second soft channel detector to generate a second signal and detecting a number and location of the insertions or deletions in the second signal.

In one embodiment, the method further comprises subtracting the first signal from an output of the soft ECC decoder to generate the reference signal.

In one embodiment, the second soft channel detector is a Viterbi channel detector.

In another embodiment, the present invention includes an error correction system comprising a first error correction stage to receive a digital signal and a plurality of subsequent error correction stages to perform additional corrections for data insertions or deletions and data errors and to generate a plurality of subsequent reference signals. The first error correction stage is configured to perform a first error correction including a first correction for data insertions or deletions and a first correction of data errors and to generate a reference signal. Each subsequent error correction stage performs the additional correction for data insertions or deletions based on the digital signal and a previous reference signal from a previous error correction stage.

In one embodiment, different error correction stages use different correction algorithms to correct for the data insertions or deletions.

In one embodiment, at least one error correction stage comprises a soft channel detector between the digital signal and a first insertion/deletion detector to correct for the data insertions or deletions and at least one other stage comprises a hard channel detector between the digital signal and a second insertion/deletion detector correct for the data insertions or deletions.

In one embodiment, one or more reference signals correspond to the digital signal having been corrected.

In one embodiment, at least one reference signal comprises log likelihood ratios.

In one embodiment, at least one reference signal is a difference signal, and wherein the difference signal is generated by subtracting an input to a soft ECC decoder from an output of the soft ECC decoder.

In one embodiment, at least one error correction stage comprises a first insertion/deletion detector to detect a number and location of the insertions or deletions in the digital signal, a data synchronizer to synchronize the digital signal using the detected number and location of insertions or deletions and to generate a synchronized signal, a first hard channel detector to process the synchronized signal and to generate a first binary signal, and a hard ECC decoder to process the first binary signal and to generate one of said reference signals. An error correction stage subsequent to said at least one error correction stage comprises a second hard channel detector to process the digital signal to generate a second binary signal and a second insertion/deletion detector to detect a number and location of insertions or deletions in the second binary signal using said one of said reference signals from the previous stage.

In one embodiment, at least one error correction stage comprises a first insertion/deletion detector to detect a number and location of the insertions or deletions in the digital signal, a data synchronizer to synchronize the digital signal using the detected number and location of insertions or deletions and to generate a synchronized signal, a first soft channel detector to process the synchronized signal and to generate a first signal, and a soft ECC decoder to process the first signal and to generate one of said reference signals. An error correction stage subsequent to said at least one error correction stage comprises a second soft channel detector to process the digital signal and said one of said reference signals from the previous stage and to generate a second signal and a second insertion/deletion detector to detect a number and location of the insertions or deletions in the second signal.

The following detailed description and accompanying drawings provide a better understanding of the nature and advantages of the present invention.

DETAILED DESCRIPTION

Described herein are systems and methods for multistage error correction. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
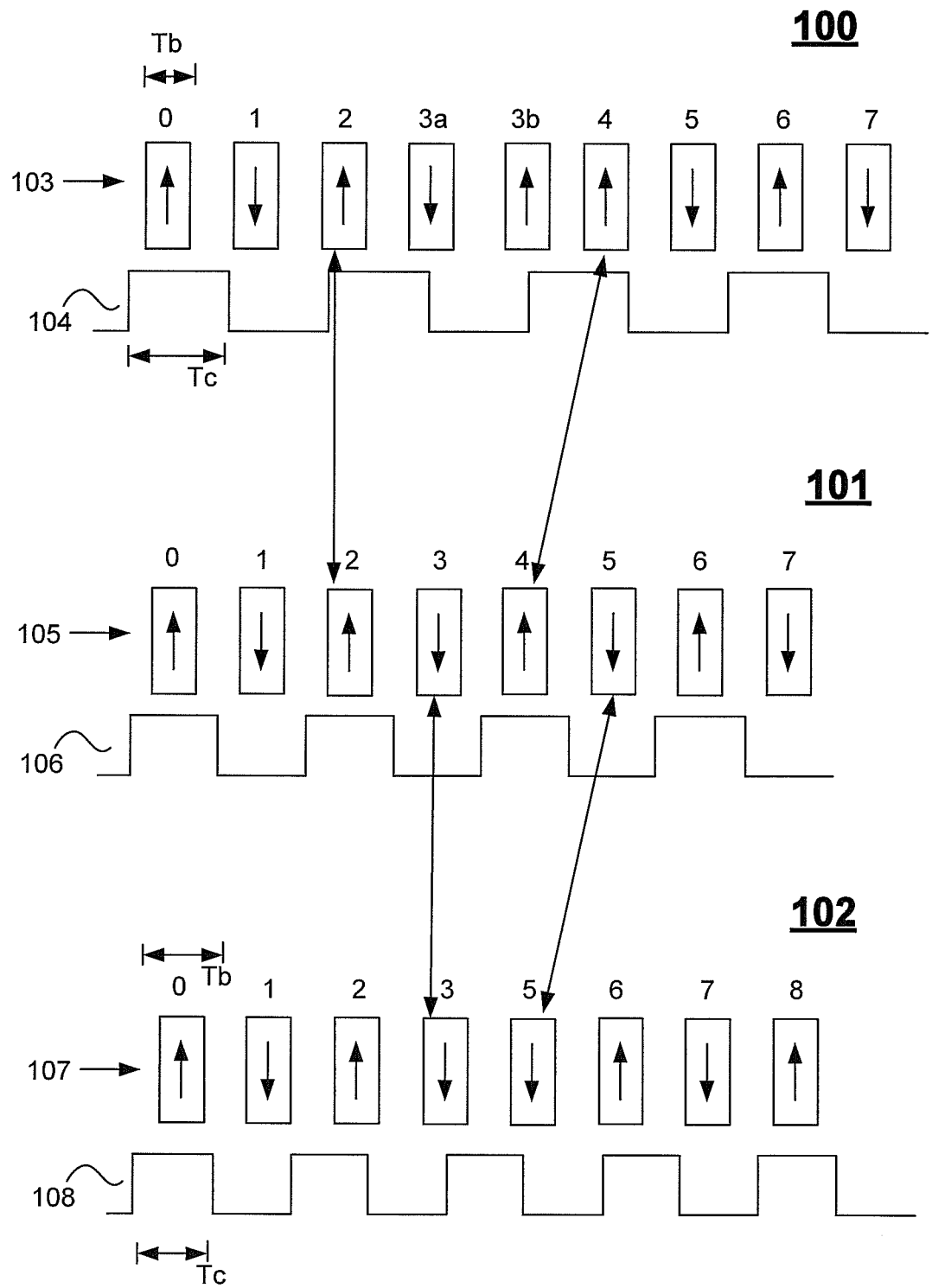
FIG. 1 illustrates bit insertion and deletion errors due to loss of synchronization during a write operation.
Figure 2:
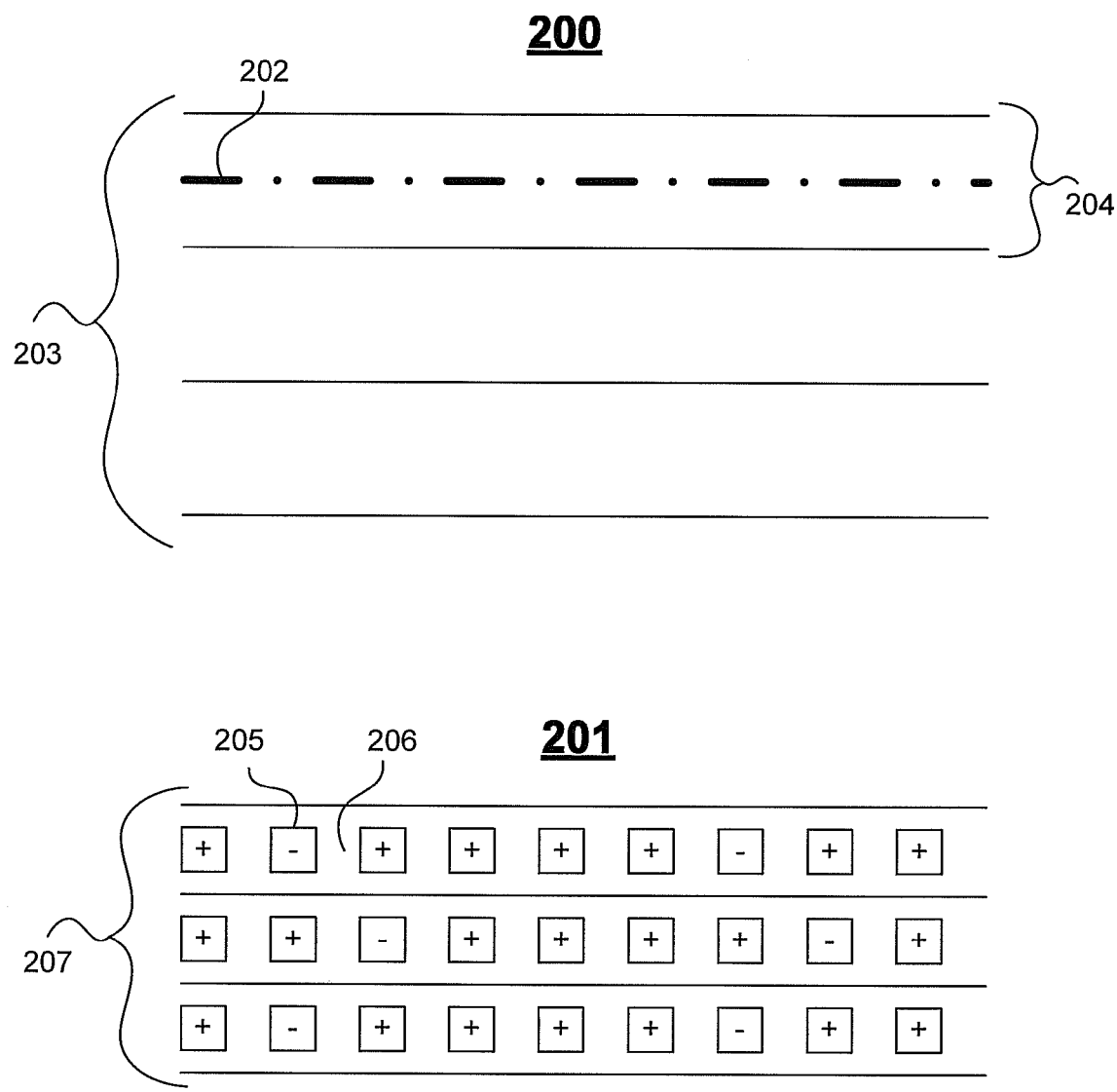
FIG. 2 illustrates an example of a traditional magnetic media and magnetic bit pattern media used for recording digital data.
Figure 3:
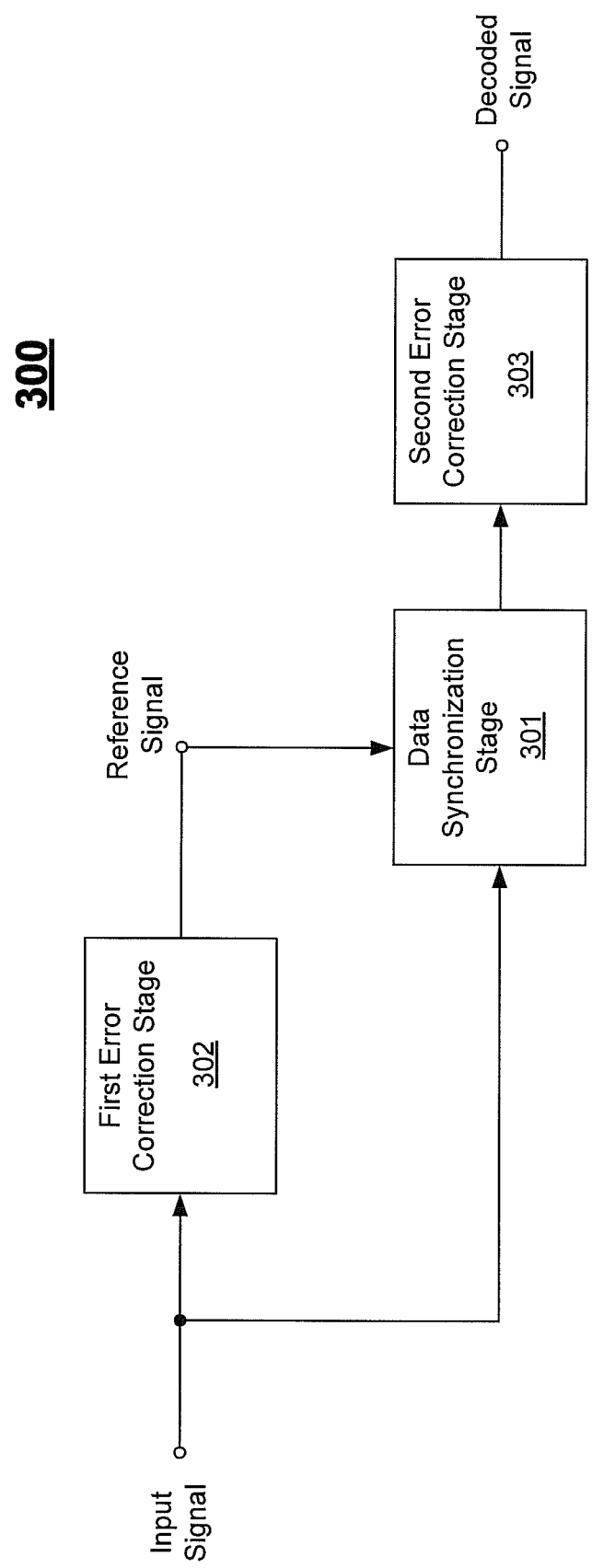
FIG. 3 illustrates a block diagram of an error correction system according to one embodiment of the present invention.

FIG. 3 illustrates a block diagram of an error correction system 300 according to one embodiment of the present invention. Block diagram 300 includes data synchronization stage 301, first error correction stage 302, and second error correction stage 303. Data synchronizer 301 corrects a digital input signal based on the reference signal generated by the first error correction stage 302 to generate a synchronized signal.

First error correction stage 302 receives a digital input signal comprising a stream of digital data values. The digital data signal may be either bipolar data signal or sampled digital signal, for example. A biploar data signal comprises a stream of bipolar data values (e.g., +1 or −1; 0 or 1), for example. Alternately, the digital input signal may be a sampled digital signal comprising sampled data values, which include binary bits that represent samples of analog signal values received from a data source, such as hard drive read channel, for example. First error correction stage 302 utilizes a received digital signal to generate a reference signal. In particular, first error correction stage 302 is configured to process the digital signal to perform a first error correction. For instance, first error correction stage 302 may perform a first correction for data insertions or deletions and a first correction of data errors to generate a reference signal. Insertions or deletions are instances where bits are inserted or deleted from the bit stream. Data errors are instances where no bits are inserted or deleted, but the data values are erroneous. The first correction may correct the digital input signal to a first correction accuracy as compared with second correction described below. Accordingly, the reference signal corresponds to the digital signal having been corrected to a first correction accuracy.

Example techniques for detection of bit insertion and deletion may utilize various coding schemes such as comma-free codes and synchronizer marks, for example. Many of these schemes may have a certain degree of uncertainty in locating the exact location of the bit insertions and deletions. Due to this uncertainty, the region around a determined position of an insertion may be erased and then the entire data sequence may be corrected using an error decoding operation. The length of the erasure may depend on the level of uncertainty of the determined position of the insertion. The table below shows a number of received samples and an example erasure process.

then the accuracy in determining the location may be limited such that after a value is added or removed, 10 blocks may need to be erased. This translates into the loss of 200 data values, which increases the error in the digital signal and may significantly degrade system performance. Features and advantages of the present invention include generating a reference signal using a first correction with a first accuracy, and using the reference signal in a second correction to reduce to improve accuracy of determining the location of the insertion or deletion.

Accordingly, the first error correction stage 302 generates a reference signal corresponding to the digital signal having the data insertions or deletions corrected to a first correction accuracy. In one embodiment, the first error correction stage 302 may include an ECC decoder that may perform the first correction for data errors. The errors introduced by the insertion of dummy bits (e.g. erasure 0's in locations 8-11 in table

TABLE 1

| Sample Index | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Received Samples | 5.1 | −2.2 | 3.4 | 1.2 | 0.8 | 4.5 | −2.5 | −7.2 | 1.3 | 3.4 | 5.6 | 0.5 | −3.4 | −7.4 | −8.2 |
| Synchronized Samples | 5.1 | −2.2 | 3.4 | 1.2 | 0.8 | 4.5 | −2.5 | 0 | 0 | 0 | 0 | −3.4 | −7.4 | −8.2 | |

The resynchronized samples in the table are a result of an insertion detected at position (index) 10. The sample at position 10 is removed and surrounding samples within a window (i.e. at index 8-9 and 11-12 of the received samples) are set to 0 according to the level of uncertainty regarding position 10 as the location of the insertion. If a deletion were detected, a 0 value may be added to the estimated location and samples around the estimated position may be also set to 0 in order to take into account the level of uncertainty of the estimated location. The 0 values may facilitate error correction coding (ECC) decoding.

For some embodiments, the uncertainty (or accuracy) of the detected insertion/deletion location lacks precision. Accordingly, the first correction may operate across a segment of the digital data. For instance, after the first correction detects an insertion or deletion and identifies the location, the system may perform a correction (insert or delete a data value) and erase bits across a segment of the digital data. One example segment of data may include a block of data. A block of data may include 100 data values or more, for example. Specifically, if an insertion or deletion is detected, the system may detect the location of such insertion or deletion as being within a specified block (but may not be any more accurate than designating the block as a whole). As part of the first correction, a data value (e.g., a bit or sample) may be removed or added from the block to correct for the insertion or deletion, and the entire block may be erased. In some applications, some or all of the immediately preceding and immediately following blocks may also be erased. As described below, synchronization of the digital signal based on the reference signal may target the location of insertions or deletions with much more accuracy (e.g., to within the specific digital data value), thereby reducing the number of bits to be erased and reducing the errors in the signal.

As mentioned above, for some schemes, the uncertainty of the detected insertion/deletion is in terms of blocks, and may not be accurate to within a particular data value. Each block may consist of M values (bipolar or sample values). As an example, if M=20 (i.e., a block consists of 20 data values), 1 above) may be resolved by the ECC decoding and result in a reference signal having reduced errors. The ECC decoding may be a Reed-Solomon decoder, BCH (Bose Ray-Chaudhuri Hocquenghem) decoder, LDPC (low density parity code) decoder, or turbo decoder, for example.

As mentioned above, data synchronization stage 301 utilizes the reference signal to synchronize the data stream of the digital input signal. Data synchronization stage 301 processes the digital signal and the reference signal to perform a second correction for data insertions or deletions to generate a synchronized signal. The second correction of the digital signal for data insertions or deletions is based on the reference signal, which has already been coarsely corrected. Accordingly, the correction accuracy of the second correction is more accurate than the first correction accuracy. As mentioned above, data synchronization may be performed on bipolar data values or on sampled data values, for example. Table 1 above is an example of data samples. Each sample represents one data value and may include several bits. In contrast, the input signal may already be a sequence of bipolar data values, which may be represented as data bits, wherein each bit represents a data value (e.g., a data value of +1/−1 or 1/0 as received from a bit pattern media or other source).

Data synchronization stage 301 may perform comparison of the reference signal to the digital input signal to determine the number of insertions or deletions. If one or more data insertions are detected, a number of data values equal to the number of insertions may be deleted. Similarly, if one or more deletions are detected, a number of data values equal to the number of deletions may be inserted. The second correction may further include determining a location for each insertion or deletion and erasing data bits around the location for each insertion or deletion. In one embodiment, comparing the reference signal and digital input signal may be performed using a linear programming algorithm, such as a Viterbi algorithm, for example. As mentioned above, the uncertainty of detecting the location of the insertion/deletion in data synchronization stage 301 may be less than the uncertainty of the detecting used in the first error correction stage 302. In one embodiment, accuracy of the second correction may allow insertion/deletion corrections to within particular data values. For example, if an insertion is detected as described above, then the accuracy of the location of the insertion may determined such that a data value may be removed (e.g., the particular value inserted) and only a few data values around the data value may be erased, if any. Similarly, if a deletion is detected, then the accuracy of the location of the deletion may determined such that a data value may be added (e.g., a dummy value of 0) and only a few data values around the added data value may be erased, if any. The improved accuracy in determining the location, achieved by using a reference signal which is itself a coarsely corrected digital input signal, results in a large reduction in the number of erasures (e.g., compared to the erased blocks of the first correction), and therefore, an improved accuracy.

The resulting synchronized signal generated by data synchronization stage 301 is received by second error correction stage 303. Second error correction stage 303 may perform a second correction of data errors. For instance, in one embodiment error correction state 303 may decode the synchronized signal using an error correction code. For example, error correction stage 303 may be an error correction code (ECC) decoder, which may correct for data errors caused by the erasure of bits in the synchronization stage 301. The output of error correction stage 303 is a decoded signal.

Figure 4:
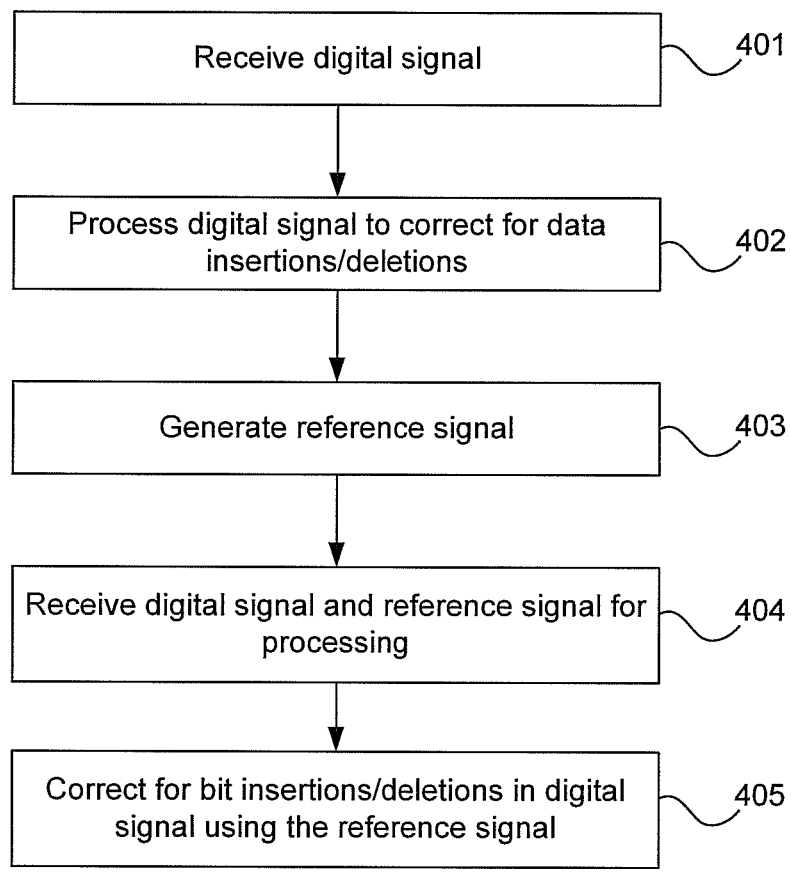
FIG. 4 illustrates a method of error correction according to another embodiment of the present invention.

FIG. 4 illustrates a method of error correction 400 according to an embodiment of the present invention. At 401 a digital signal is received. At 402, the digital signal is processed to correct for data insertions/deletions. This process may include detecting bit insertions/deletions and then correcting these detected discrepancies to reduce data errors in the data sequence of the digital signal. The first error correction may be block based and have a level of uncertainty in the location of the insertion/deletions, for example. The process may further include erasing a group of data bits according to the uncertainty of detection as described above. At 403, a reference signal is generated. Generating the reference signal may include decoding the partially synchronized signal with erasures using an ECC. In this example, the ECC results in a reference signal corresponding to the digital input signal having been corrected to a first correction accuracy. At 404, the digital signal and the reference signal are received for further processing. At 405, the bit insertions/deletions are corrected in the digital signal using the reference signal. The process of correction may include comparing the digital signal and the reference signal for discrepancies in order to produce a synchronized signal from the digital signal. An example of the comparing process may include the use of a linear programming algorithm such as Viterbi, for example. Additionally, a branch metric computation for a bit-based trellis may be used, which may indicate the location of insertions/deletions as described in more detail below. The process of error correction may result in a synchronized signal. This synchronized signal may be decoded using an ECC. This may correct any errors introduced during the synchronization process (e.g. adding dummy bits). The process of correction may be accurate to approximately within specific data values inserted or deleted, and may provide a synchronized signal having a more accurate correction than the first correction accuracy.

Figure 5:
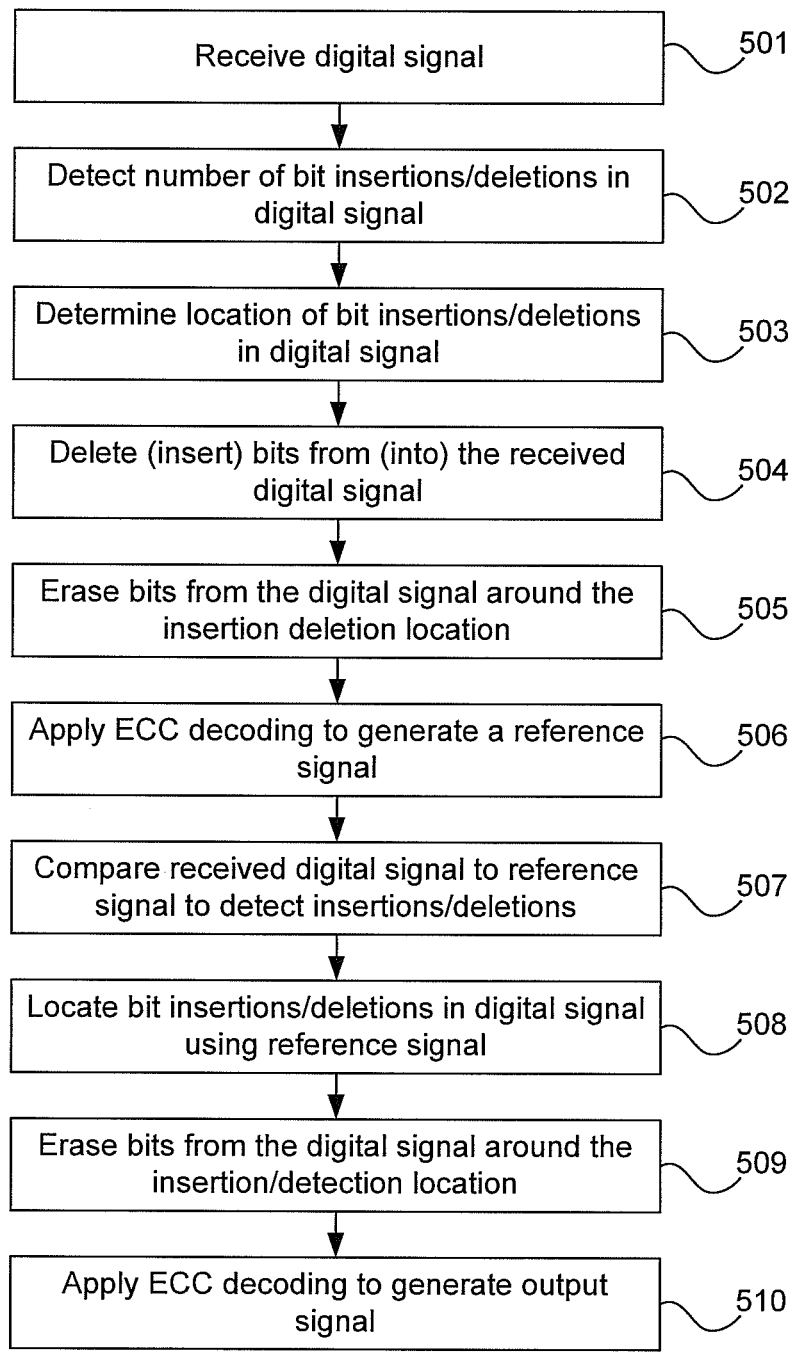
FIG. 5 illustrates a method of error correction according to yet another embodiment of the present invention.

FIG. 5 illustrates a method of error correction 500 according to yet another embodiment of the present invention. At 501 a digital signal is received. At 502, a number of bit insertions/deletions are detected in the digital signal. This may be similar to what has been described above. At 503, the locations of the bit insertions/deletions are determined. At 504, bits are deleted from the digital signal when an insertion is detected, and dummy bits are added into the digital signal when a deletion is detected. At 505, bits are erased around the insertion/deletion location. The erasure length around the insertion/deletion location may be based on the accuracy of the insertion/deletion detector. At 506, ECC decoding is applied to generate a reference signal. The dummy bits added in 504 may be corrected by error decoding. At 507, the digital signal is compared with the reference signal to detect insertions or deletions in the digital signal. The comparison may utilize linear programming as mentioned above. At 508, bit insertions/deletions are located in the digital signal using the reference signal. At 509, values are erased from the digital signal around the insertion/deletion location. The result is a synchronized signal. The accuracy of step 508 may be greater than the accuracy of step 503 and therefore, the erasure length at step 509 may be smaller than at step 505. At 510, ECC decoding is applied to the synchronized signal to generate an output signal.

Figure 6:
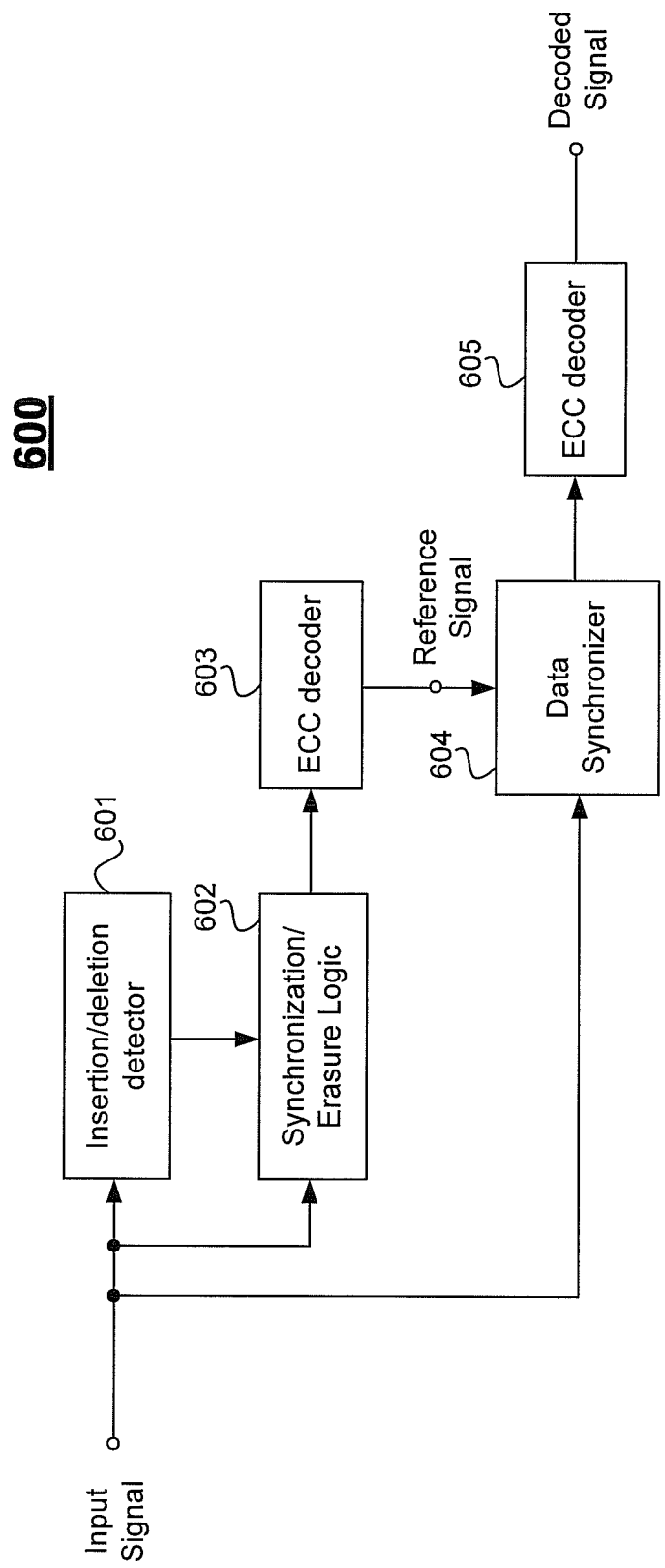
FIG. 6 illustrates a block diagram of an error correction system according to one embodiment of the present invention.

FIG. 6 illustrates a block diagram of an error correction system 600 according to one embodiment of the present invention. System 600 includes insertion/deletion detector 601, synchronization/erasure logic 602, ECC decoder 603, data synchronizer 604, and ECC decoder 605.

Insertion/deletion detector 601 receives a digital input signal and detects a number of insertions or deletions in a segment (e.g., a block) of the digital input signal. Insertion/deletion detector 601 further detects an approximate location of the insertions or deletions in the segment (e.g., to within a particular block). Insertion/deletion detector 601 provides the number of insertions/deletions and their approximate locations to synchronization/erasure logic 602. The locations may be determined with a first accuracy as described above. For example, the location may be specified as a particular block in the received digital input signal.

Synchronization/erasure logic 602 may partially synchronize the data sequence of the input signal by removing or adding bits at the location of the insertion/deletions. A window of erasures may be made around the insertion deletions based on the first accuracy of the insertion/deletion detector 601. The erasure may set a window of bits in the data sequences to a predetermined value such as 0, for example. Synchronization/erasure logic may add or remove a data value in a particular block, and may further erase data values in the digital input signal in and around the particular block. Synchronization/erasure logic 602 generates a synchronized erased signal. The resulting synchronized erased signal is synchronized because the inserted/deleted data value has been corrected. However, the limited accuracy of the first correction process results in a large number of erasures, which corresponds to an error in the received signal. The errors caused by the erasures may be reduced using error decoding performed by ECC decoder 603 ("ECC Decoder 1"). ECC decoder 603 receives the synchronized erased signal and performs error decoding using an error correction code. ECC decoder 603 may produce the reference signal to data synchronizer 604. Data synchronizer 604 compares the digital input signal with the reference signal as described above to produce a synchronized signal having the insertions or deletions corrected to a second accuracy. The synchronized signal generated by data synchronizer 604 is coupled to a second ECC decoder 605 ("ECC Decoder 2") to correct data errors and produce a decoded signal.

Figure 7A:
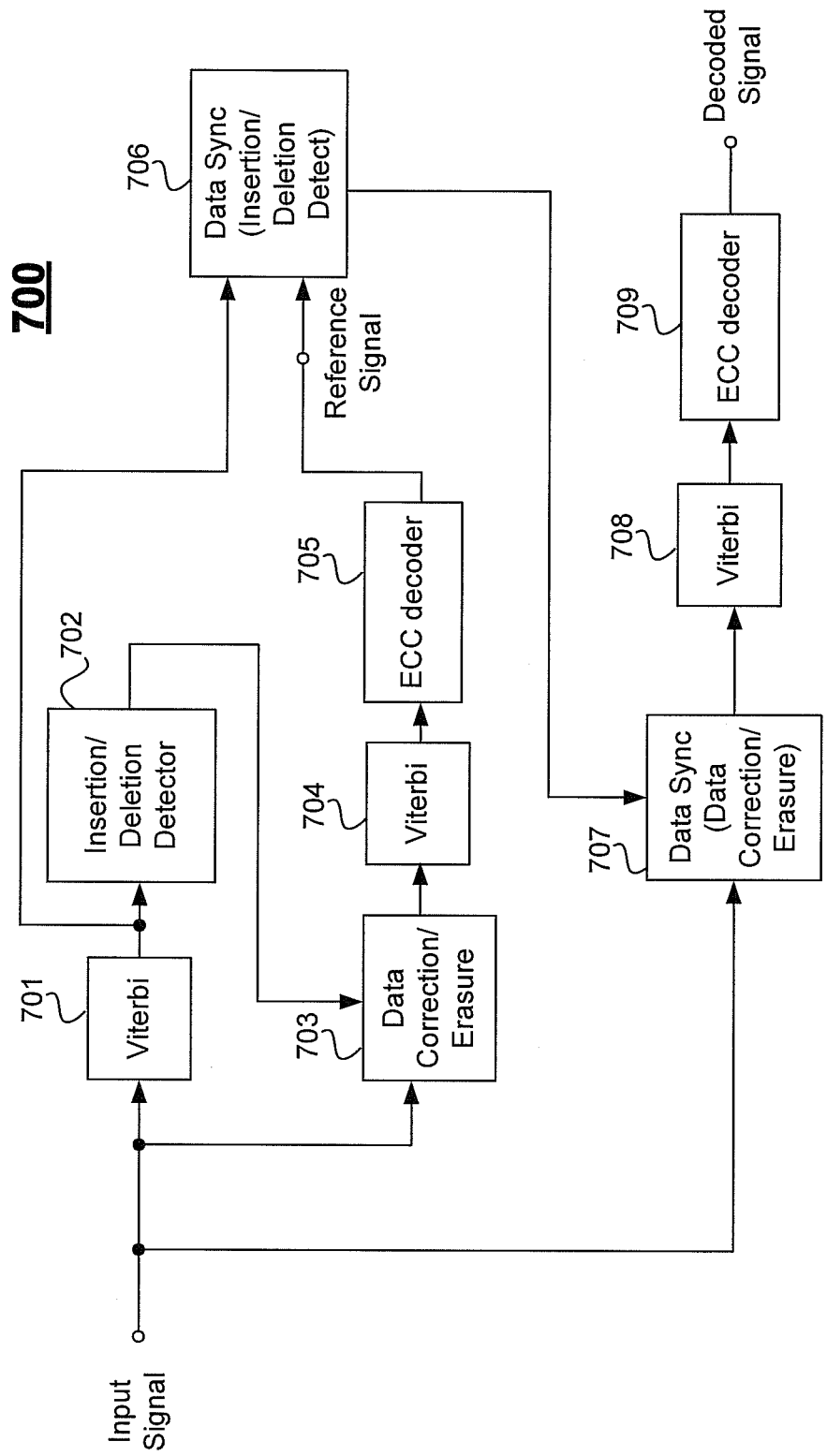
FIG. 7A illustrates an error correction system according to another embodiment of the present invention.

FIG. 7A illustrates a block diagram of an error correction system 700 according to another embodiment of the present invention. System 700 includes Viterbi decoder 701, insertion/deletion detector 702, data correction/erasure component 703, Virterbi decoder 704, and ECC decoder 705. In this example, the data synchronizer includes an insertion/deletion detector component 706 ("Data Sync (Insertion/Deletion Detect)") and a data correction/erasure component 707 ("Data Sync (Data Correction/Erasure)"). The output of component 707 is coupled to a Virerbi decoder 708 and ECC decoder 709. In this example, the input signal is a sampled digital signal.

Viterbi decoder 701 receives the sampled digital signal and converts the data to a bipolar data signal (e.g., +1/−1 or 1/0). Insertion/deletion detector 702 receives the bipolar data and detects insertions/deletions and an approximate location of a detected insertion or deletion. The insertion/deletion and location are provided to data correction/erasure component 703. Accordingly, data correction/erasure component 703 may add or remove sampled data values and erase the sampled data values (e.g., at a block level) to generate a first synchronized erased signal. The synchronized erased signal may be comprised of original sample data values and inserted and/or erased sample data values (e.g., 0).

Viterbi decoder 704 receives the synchronized erased sampled data signal and converts the sampled data signal to synchronized erased bipolar data signal (e.g., N-bit data values corresponding to analog values to 1-bit data values +1/−1 or 1/0). ECC decoder 705 corrects data errors introduced by the insertions or erasures and provides a bipolar reference signal to the input of insertion/deletion detector 706. Insertion/deletion detector 706 compares the bipolar data signal at the output of the Viterbi decoder 701 to the bipolar reference signal. Insertion/deletion detector 706 provides data correction/erasure component 707 with information indicating that an insertion or deletion has been detected and the location of such insertion/deletion. Data correction/erasure component 707 receives the original sampled data signal and modifies the sampled data signal to generate a synchronized sampled signal. Data correction/erasure component 707 may insert or delete a sampled data value at the location specified by the insertion/deletion detector 706 and erase values with higher accuracy than data correction/erasure component 703, which is achieved by use of the reference signal.

Viterbi decoder 708 receives the synchronized sampled signal and converts the data to a bipolar data signal. ECC decoder 709 corrects additional errors in the bipolar data signal and generates a bipolar decoded signal.

Figure 7B:
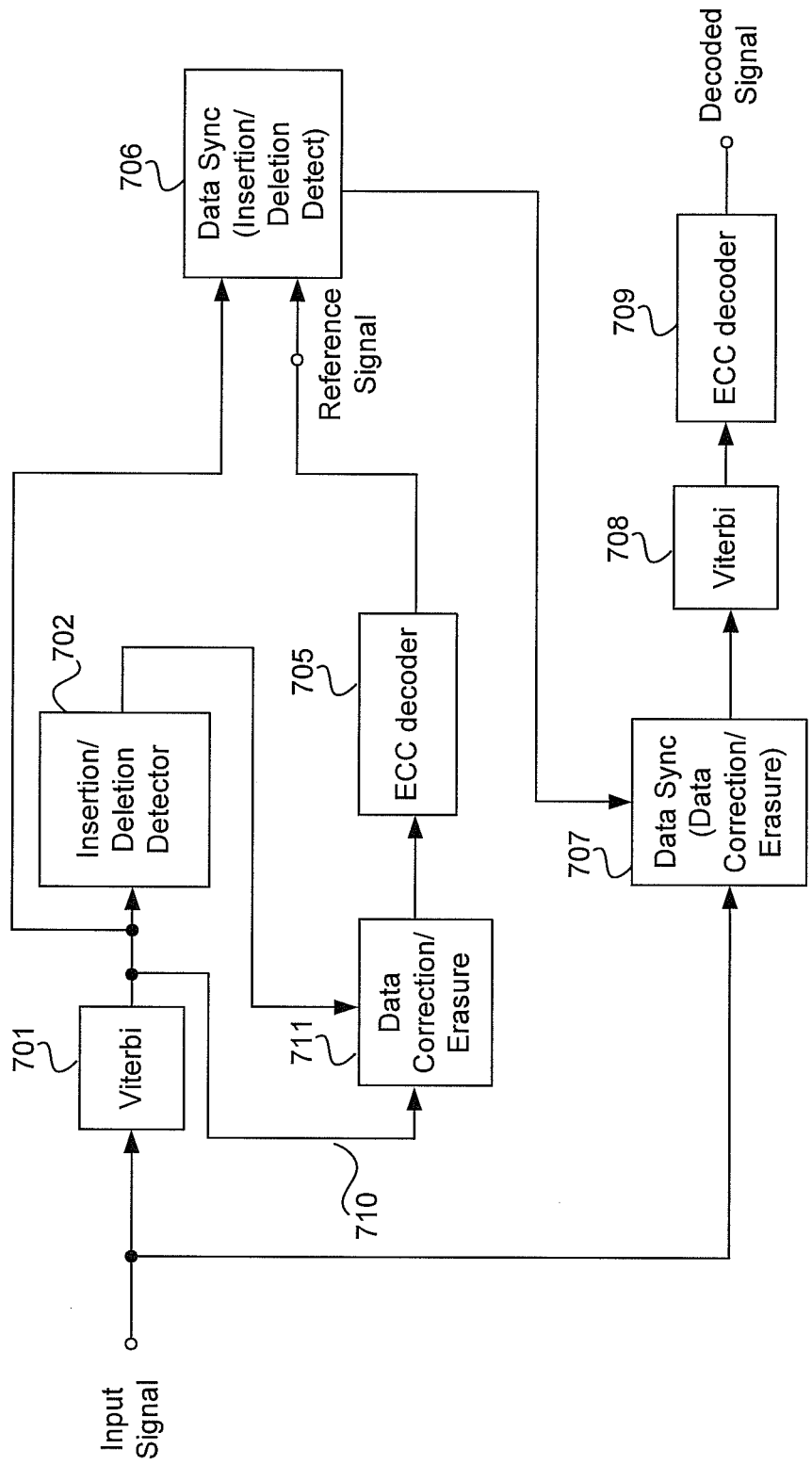
FIG. 7B illustrates an error correction system according to yet another embodiment of the present invention.

FIG. 7B illustrates a block diagram of an error correction system 720 according to yet another embodiment of the present invention. In this example, data correction/erasure component 711 receives the bipolar data signal at 710 from Viterbi decoder 701 such that Viterbi 704 in FIG. 7A is no longer required. Therefore, in this embodiment, the first correction is performed on bipolar data. Accordingly, data correction/erasure component 711 provides a synchronous erased bipolar data signal, which is corrected for data errors by ECC decoder 705 to generate the reference signal.

Figure 8A:
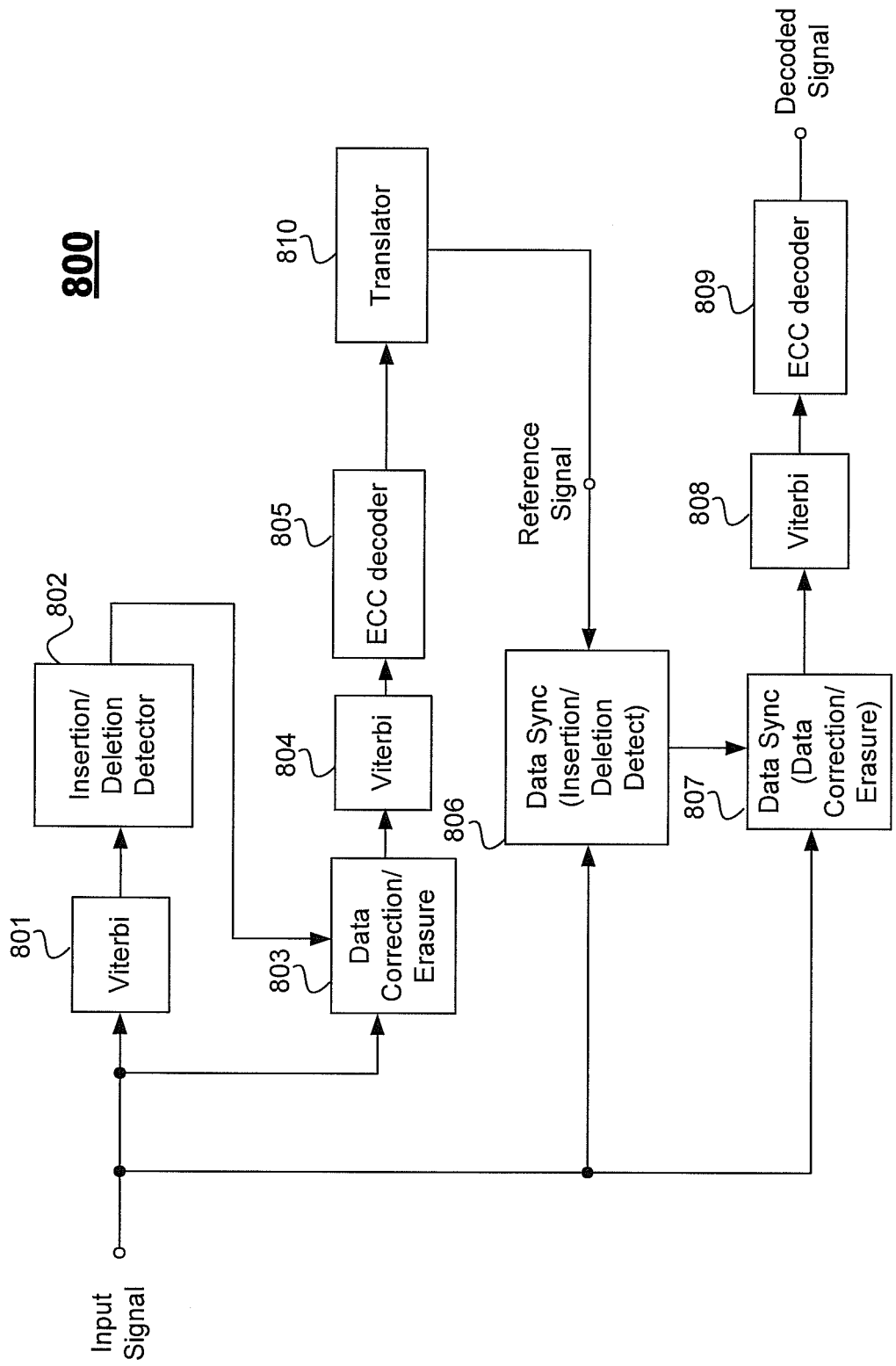
FIG. 8A illustrates an error correction system according to one embodiment of the present invention.

FIG. 8A illustrates an error correction system 800 according to another embodiment of the present invention. Viterbi decoder 801, insertion/deletion detector 802, data correction/erasure block 803, Virterbi decoder 804, ECC decoder 805, Virerbi decoder 808, and ECC decoder 809 of system 800 correspond to Viterbi decoder 701, insertion/deletion detector 702, data correction/erasure block 703, Virterbi decoder 704, ECC decoder 705, Virerbi decoder 708, and ECC decoder 709 of system 700, respectively, and perform similar functions. The system performs detection of insertions/deletions, detection of a location of the insertion/deletion, data value removal or insertion, and erasure on sampled data values. The sampled data values are converted into bipolar data values by Viterbi 801 and error correction is applied. However, in this example, the corrected bipolar data values are translated back into sampled data values to generate the reference signal. In particular, translator 810 translates the bipolar reference signal into a sampled data reference signal. This reference signal containing samples is compared to the original sampled data signal in insertion/deletion detector 806 to detect and locate insertions or deletions. Detector 806 signals correction/erasure component 807 that an insertion or deletion has been detected together with the location of the insertion or deletion. Data correction/erasure component 807 also receives the original sampled data signal and uses this information to correct the input signal containing unsynchronized samples. The output of data correction/erasure component 807 is a synchronized sampled data signal. Viterbi decoder 808 translates synchronized sampled data signal into a bipolar synchronized data signal, and ECC decoder 809 may function in a similar manner to Viterbi decoder 708 to produce a bipolar decoded signal.

Figure 8B:
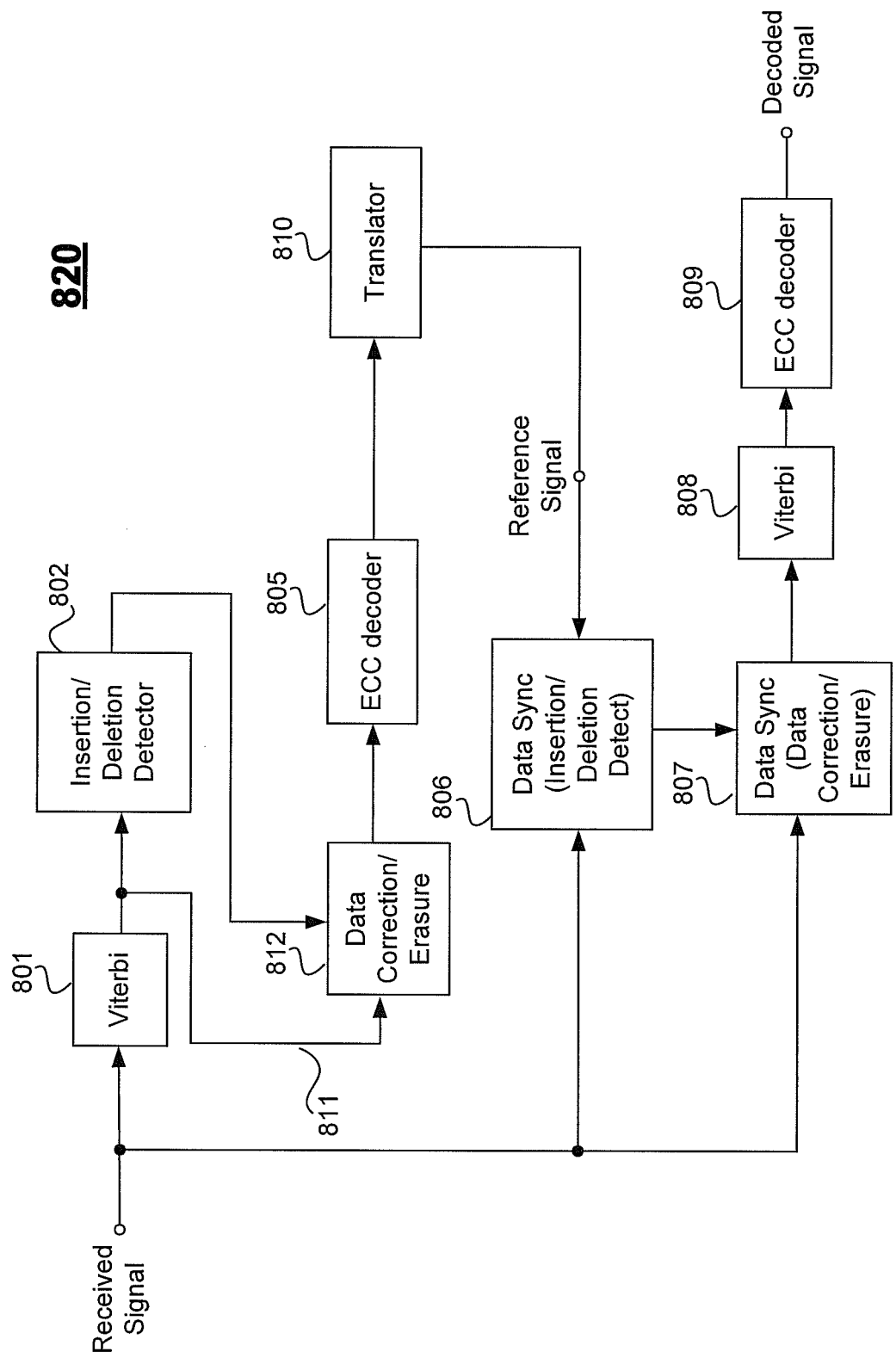
FIG. 8B illustrates an error correction system according to another embodiment of the present invention.

FIG. 8B illustrates an error correction system 820 according to another embodiment of the present invention. System 820 is different than system 800 in that data correction/erasure component 812 receives the bipolar data signal at 811 from Viterbi decoder 801 such that Viterbi 804 is no longer required. Data correction/erasure block 811 produces a synchronized erased bipolar data signal, which is corrected for data errors and translated as in FIG. 8A.

Figure 9:
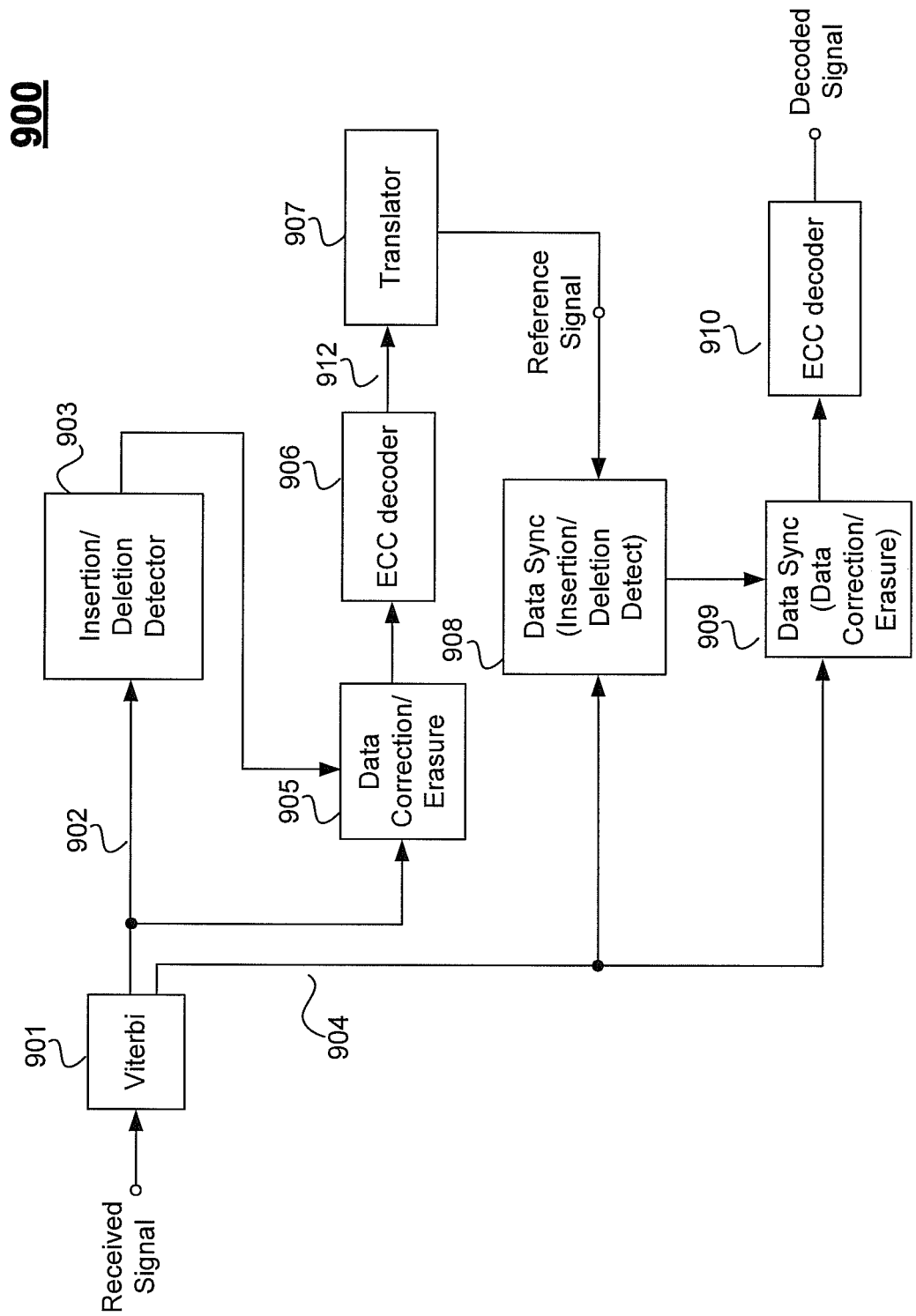
FIG. 9 illustrates an error correction system according to yet another embodiment of the present invention.

FIG. 9 illustrates an error correction system 900 according to yet another embodiment of the present invention. System 900 includes Viterbi decoder 901, insertion/deletion detector 903, data correction/erasure component 905, ECC decoder 906, translator 907, insertion/deletion detector 908, data correction/erasure component 909, Virerbi decoder 910, and ECC decoder 911. In this example, the digital input signal is a sampled digital signal, which is converted into a bipolar data signal on the front end using Viterbi decoder 901. For example, Viterbi 901 may be used as a channel detector so that the data is processed downstream as bipolar data.

In this example, Viterbi decoder 901 receives the sampled digital signal and converts the sampled digital signal into two different signals on two outputs. The first output of Viterbi 901 is a bipolar data signal at 902, which is used to detect insertions/deletions and locations, and the second output is a log likelihood ratio ("LLR") signal at 904. Insertion/deletion detector 903, data correction/erasure block 905, and ECC decoder 906 perform the same functions as insertion/deletion detector 802, data correction/erasure block 812, and ECC decoder 805 of system 820 of FIG. 8B to produce a bipolar reference signal 912.

In this example, translator 907 converts the binary reference signal 912 to a LLR reference signal. In another embodiment, EEC decoder 906 outputs LLR values and the translator is omitted. Insertion/deletion detector 908 compares the LLR data signal at 904 to the LLR reference signal at the output of translator 907. This may utilize a LLR based trellis as described in more detail below. Insertion/deletion detector 908 provides information regarding the location and insertions and deletions to data correction/erasure component 909. Data correction/erasure block 909 receives the LLR data signal and modifies the data sequence according to the information provided by insertion/deletion detector 908 and produces a synchronized LLR signal. ECC decoder 910 corrects additional errors based on the LLR signal and provides the decoded bits.

Figure 10:
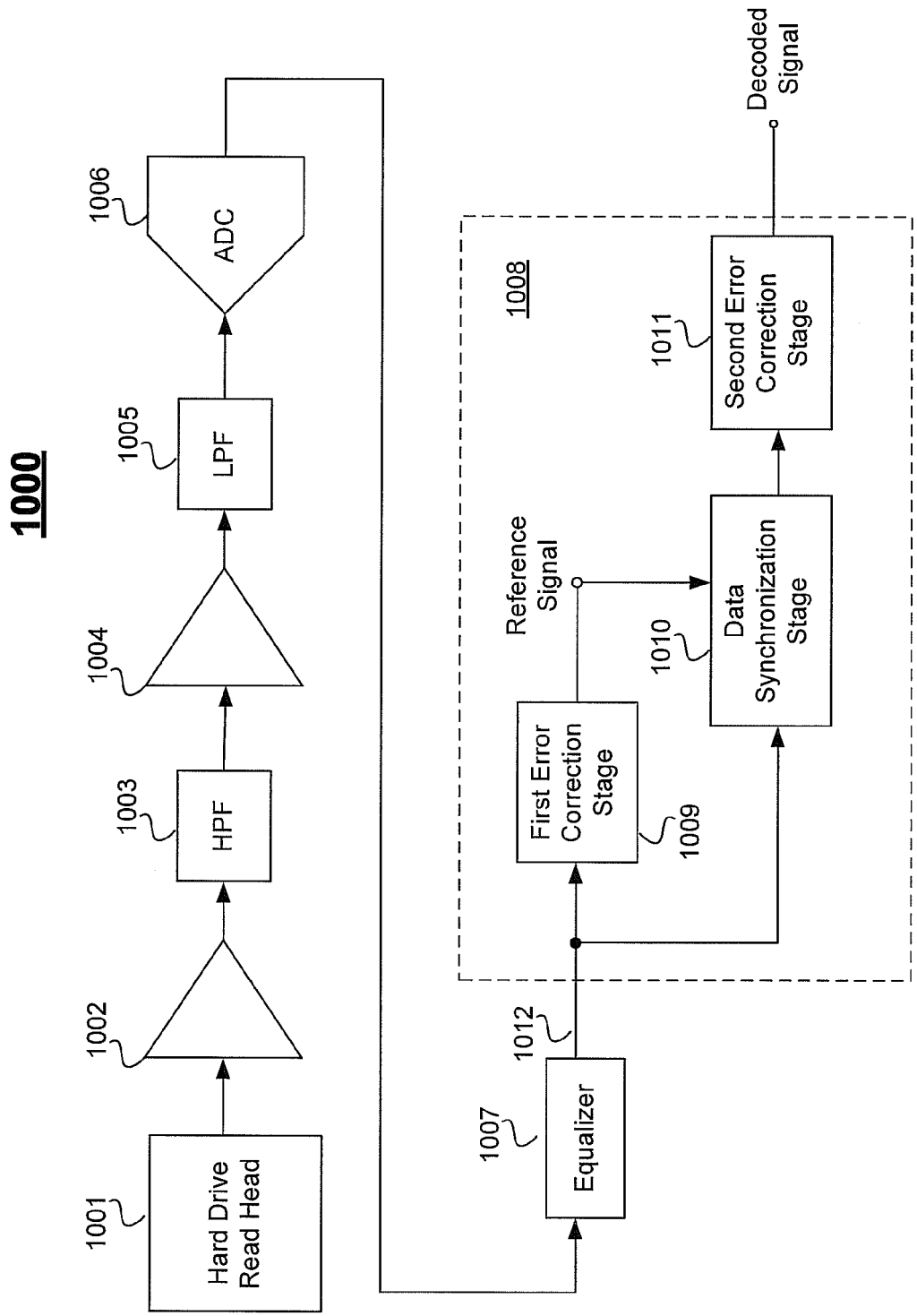
FIG. 10 illustrates a hard drive system according to one embodiment of the present invention.

FIG. 10 illustrates a block diagram of a hard drive system 1000 according to one embodiment of the present invention. Hard drive system 1000 includes read head 1001, preamplifier 1002, high pass filer (HPF) 1003, variable gain amplifier (VGA) 1004, low pass filter (LPF) 1005, analog-to-digital converter (ADC) 1006, equalizer 1007, first error correction stage 1009, data synchronization stage 1010, and second error correction stage 1011. Read head 1001 reads analog data from a hard drive, which may include a source medium such as a bit patterned medium for example. Read head 1001 senses a signal from the hard drive (not shown) and preamplifier 1002 provides gain to this analog signal. The analog signal is passed through HPF 1003 to remove any DC (direct current) offsets and VGA 1004 provides a variable gain to improve the signal strength. This analog signal is passed through LPF 1005 to remove undesirable high frequency components from the signal, and ADC 1006 converts the analog signal into a sampled digital signal. Equalizer 1007 may be a finite input response filter (FIR) for performing further signal conditioning to produce a sampled digital input signal at location 1112. The error correction portion 1008 of system 1000 receives the sampled digital signal and provides a decoded signal using the techniques described in FIG. 3 and example techniques described above.

Figure 11:
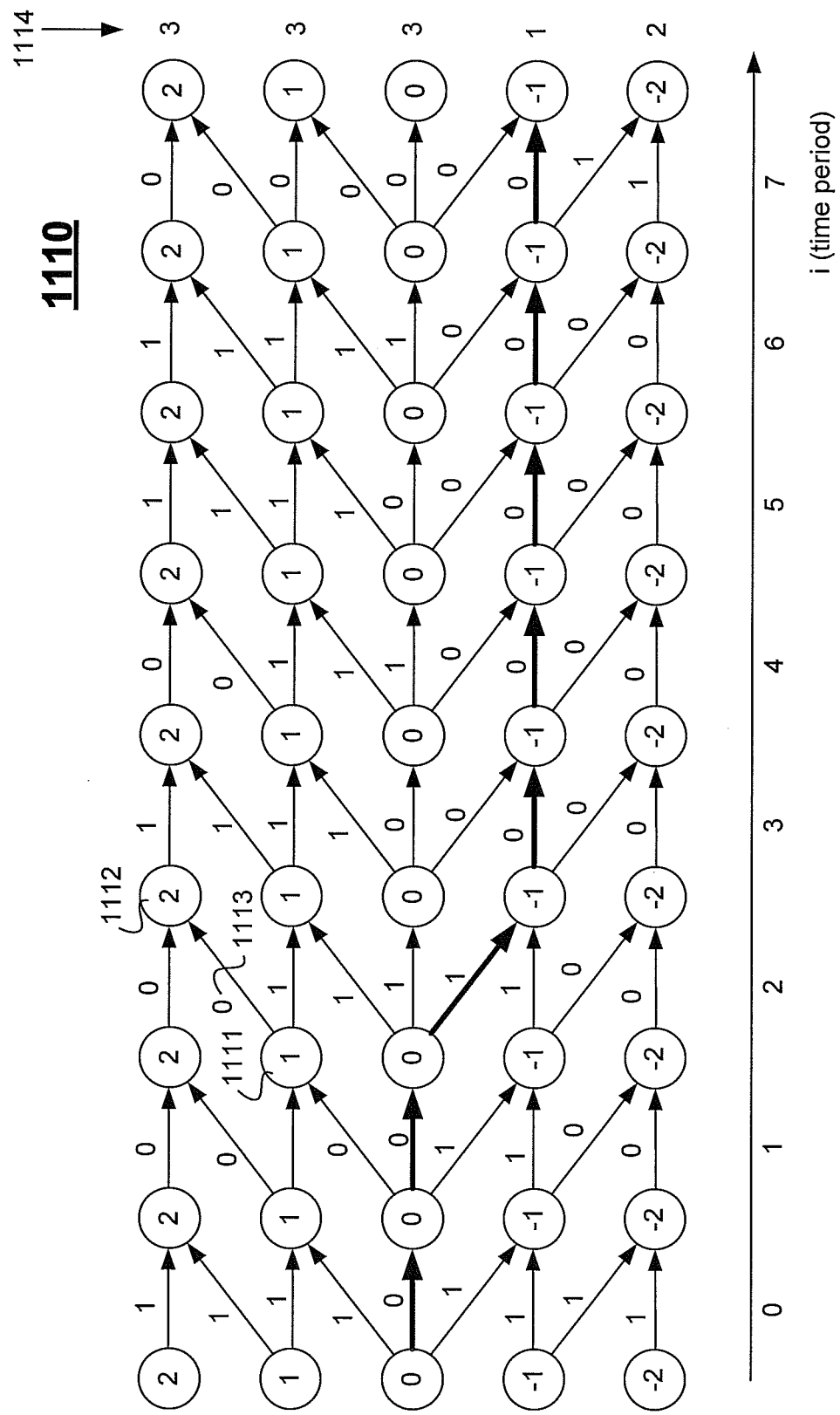
FIG. 11 illustrates a trellis used by a data synchronizer according to one embodiment of the present invention.

FIG. 11 illustrates a bit-based trellis 1110 utilized by the data synchronizer 604 according to one embodiment of the present invention. In an embodiment utilizing an input signal and reference signal comprised of bipolar data values, a data synchronizer may utilize a trellis for performing the comparison. The two data inputs may be two bipolar data streams (hard-decision) sequences or two weighted-decision (e.g., LLR or other soft-decision) sequences.

In a bipolar embodiment, the input signal bit sequence is compared to the reference signal bit sequence. The data synchronizer may utilize a bit-based trellis wherein each branch corresponds to one bit of data in time. The branch values (e.g. branch value 1113) may be computed by a bit-wise comparing between the input signal bit sequence and the reference signal bit sequence. The bit difference (BD) may be computed for each state s as follows: for the $i^{th}$ time period, $$BD(s,i) = \{0 \text{ for } c_i = b_{i+s}, 1 \text{ for } c_i \neq b_{i+s}\}$$

The s term represents the state of insertions/deletions. Assuming the maximum insertion/deletion value is 2, the possible states (s) (e.g. state 1111 and 1112) are two insertions (2), one insertion (1), no insertions/deletions (0), one deletion (−1), and two deletions (−2). The $c_i$ term represents a data entry in the reference signal at the $i^{th}$ time period and $b_{i+s}$ represents a data entry in the input signal at the (i+s) time period. For example, the branch metric (BM) between states $s_1$, $s_2$ (i.e. between the state of 1 insertion and 2 insertions) may be as follows:

$$BM(s_1,s_2,i) = \{0 \text{ for } BD(2,i)=0, 1 \text{ for } BD(2,i)=1\}$$

For example, c=[10100110] and b=[10001100] and the BM($s_1$, $s_2$, i=2) may be calculated as follows:

$$BD(s=2,i=2) = \{0 \text{ because } c_2=1=b_{2+2}=1\},$$

$$BM(s_1,s_2,i=2) = \{0 \text{ because } BD(2,2)=0\}$$

Branch metric (BM) 1113 is 0. Bit based trellis 1110 includes the BM's computations, and from the final path metric 1114, the best path is determined (indicated in bold arrows) to be [0,0,0,−1,−1,−1,−1,−1]. According to the best path there is one deletion at the third position (i.e. i=2).

In a weighted-decision embodiment, the input signal likelihoods sequence may be compared to the reference signal likelihoods sequence. The likelihoods may be log-likelihood ratios (LLR) representing a binary sequence. For example, an LLR of one data entry may be:

$$LLR(x) = \log\frac{p(x=1)}{p(x=0)}$$

The LLR difference (LLRD) may be computed for each state s as follows: for the $i^{th}$ time period, $$LLRD(s,i) = LLR(b_{i+s}) - LLR(c_i)$$

For this example, the branch metric (BM) between states $s_{1,2}$ may be as follows:

$$BM(s_1,s_2,i) = LLRD(2,i)$$

In an embodiment utilizing an input signal and a reference signal comprised of samples, a data synchronizer may utilize a sample-based trellis to compare the input signal samples sequence with the reference signal samples sequence. In this embodiment, the trellis may be similar to the embodiment in which the signals are comprised of bipolar values, but the branch value computations may be different. The distance may be computed for each state s as follows: for the $i^{th}$ time period, $$\text{distance}(s,i) = (R_i - f_{i+s})^2$$

The $R_i$ term represents a data entry sample in the reference signal at the $i^{th}$ time period and $f_{i+s}$ represents a data entry sample in the input signal at the (i+s) time period. For this example, the branch metric (BM) between states $s_{1,2}$ may be as follows:

$$BM(s_{1,2},i) = \text{distance}(2,i)$$

The above examples are based on a maximum insertion/deletion value of 2, but in other embodiments, the maximum value may be different.

Figure 12:
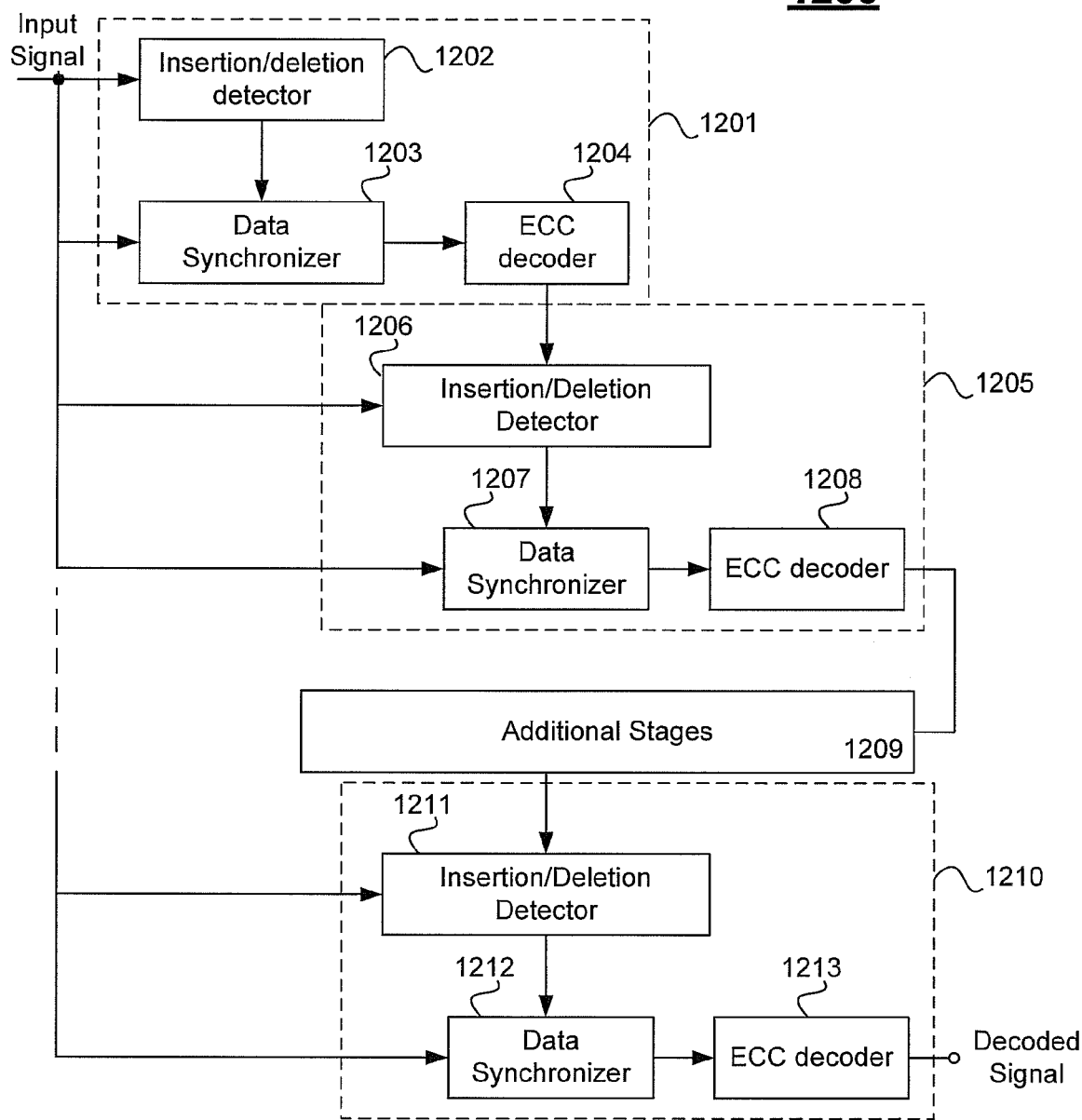
FIG. 12 illustrates an error correction system using an iterative technique according to another embodiment of the present invention.

FIG. 12 illustrates an error correction system 1200 using an iterative technique according to another embodiment of the present invention. Embodiments of the present invention include applying the output of a first error correction stage to an input of an insertion/deletion detector in a second error correction stage to further reduce errors in the signal. Multiple stages may be used to iteratively obtain signals with reduced error, where an output signal of each stage may be received by an insertion/deletion detector of a subsequent stage together with the input signal to further reduce errors. A first error correction stage 1201 includes insertion/deletion detector 1202, data synchronizer 1203, and ECC decoder 1204. An input signal is received by the insertion/deletion detector 1202, which outputs a number of insertions/deletions and locations. Data synchronizer 1203 receives the input signal and corrects insertions/deletions. The output of data synchronizer 1203 is received by ECC decoder 1204, which corrects errors in the signal. ECC decoder 1204 produces a decoded signal with errors corrected to a first accuracy. The output of ECC decoder 1204 is a reference signal coupled to an insertion/deletion detector in a second error correction stage 1205 for further improving the signal.

Here, the second error correction stage 1205 includes insertion/deletion detector 1206, data synchronizer 1207, and ECC decoder 1208. Insertion/deletion detector 1206 has one input to receive the input signal and a second input to receive the decoded signal from the previous stage. Insertion/deletion detector 1206 may include a two input channel detector as described in the examples below. Insertion/deletion detector 1206 outputs the number of insertions/deletions and locations with improved accuracy by using both the input signal and the decoded signal from the previous stage. Data synchronizer 1207 corrects for insertions/deletions. The input of ECC decoder 1208 is coupled to the output of data synchronizer 1207. ECC decoder 1208 produces a decoded signal with errors decoded to an improved accuracy over the accuracy of the first stage. The output of ECC decoder 1208 may be coupled to additional stages 1209. The output of an ECC decoder in the last stage 1209 may be coupled to an input of an insertion/deletion detector 1211 in a last stage 1210. Last stage 1210 may further include a data synchronizer 1212 and ECC decoder 1213. The output of ECC decoder 1213 may be the output of the system, for example. Using the above technique, a signal may be corrected for insertions/deletions and errors, with the output of multiple error correction stages coupled to the input of multiple subsequent stages to iteratively improve signal quality and reduce errors.

In some embodiments, different stages may process the signals using different techniques or the same techniques. For example, a first stage may receive sample data values and process the signal using a hard Viterbi decoder, which outputs binary decisions, for example, while a subsequent stage may receive log likelihood ratios and process the signal using a soft decoder (e.g., a Soft Output Viterbi Algorithm (SOVA) or BCJR decoder), which outputs decoded data in probability form. Specifically, different insertion/deletion detectors may be used in different stages on different iterations.

Figure 13:
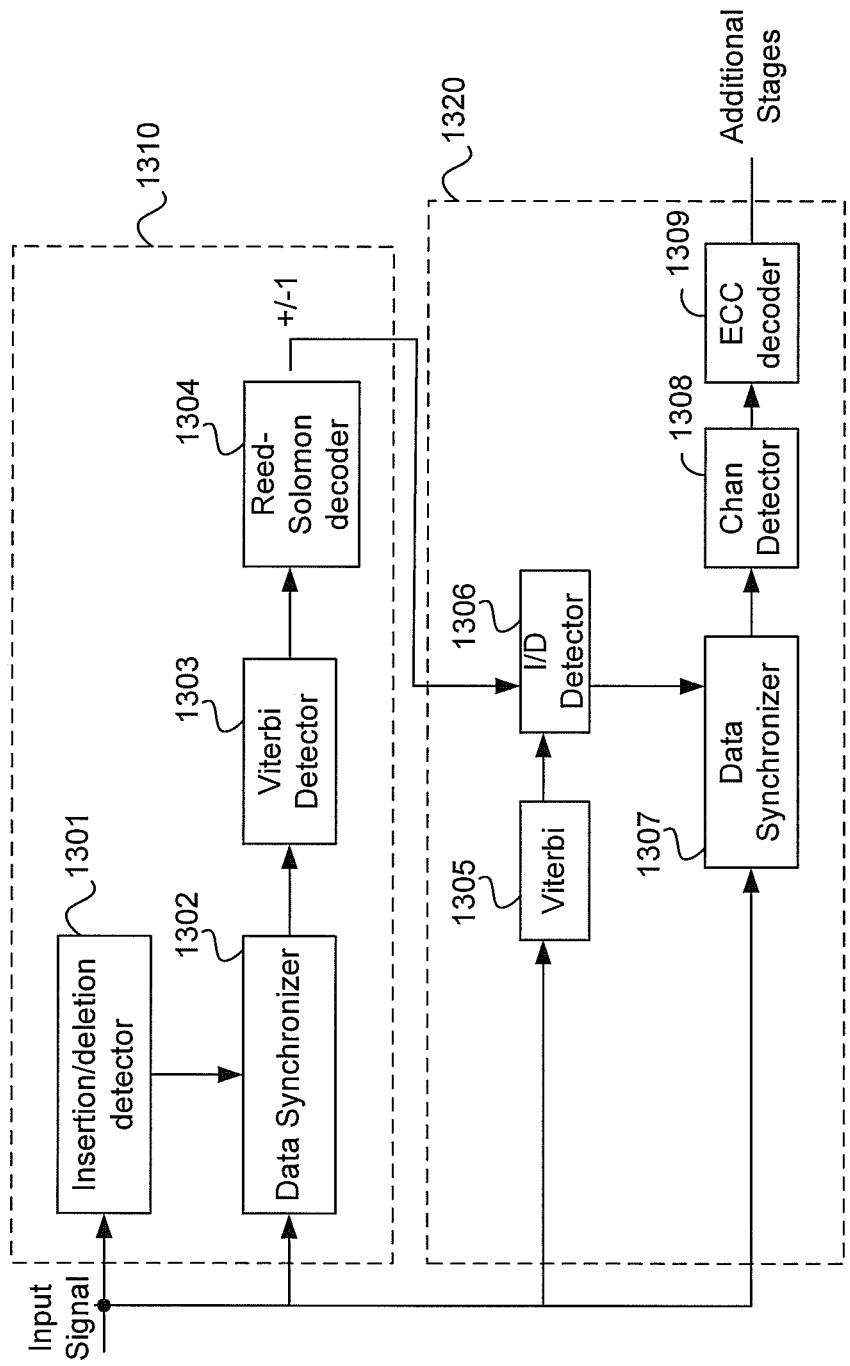
FIG. 13 illustrates an example iterative error correction system using a hard decoder according to another embodiment of the present invention.

FIG. 13 illustrates an iterative error correction system 1300 using a hard decoder according to another embodiment of the present invention. This example illustrates the use of an error correction stage having an insertion/deletion detector with a hard Viterbi decoder. For instance, the input signal is processed by a first error correction stage 1310 including insertion/deletion detector 1301, data synchronizer 1302, and Viterbi decoder 1303, and a Reed Solomon decoder 1304. Insertion/deletion detector 1301 and data synchronizer 1302 operate as described above. Viterbi decoder 1303 is an example of a hard channel detector. Viterbi decoder 1303 receives the synchronized sampled digital signal and converts the data to a bipolar data signal (e.g., +1/−1 or 1/0). The bipolar data signal is then error corrected using a Reed Solomon decoder 1304. The output of the Reed Solomon decoder 1304 is a bipolar data signal. The output of the Reed Solomon decoder 1304 may be used as a reference signal in the next stage. Since the next error correction stage 1320 receives a bipolar data signal, a hard channel decoder is used in the insertion/deletion detection process. For example, the input signal is first processed by hard Viterbi decoder 1305. Viterbi decoder 1305 has one input for receiving the input signal. The output of Viterbi decoder 1305 is provided as an input to insertion/deletion ("I/D") detector 1306. Insertion/deletion detector 1306 has a second input for receiving the signal from Reed Solomon decoder 1304. Insertion/deletion detector 1306 produces a number of insertions/deletions and locations based on both the input signal and the corrected signal from first error correction stage 1310. The output of insertion/deletion detector 1306 is coupled to data synchronizer 1307. The output of data synchronizer 1307 is coupled through a channel detector 1308 and ECC decoder 1309, which may be different than the Viterbi channel detector 1303 and Reed-Solomon decoder 1304 used in the first error correction stage (e.g., channel detector 1308 and ECC decoder 1309 may be soft rather than hard).

Figure 14:
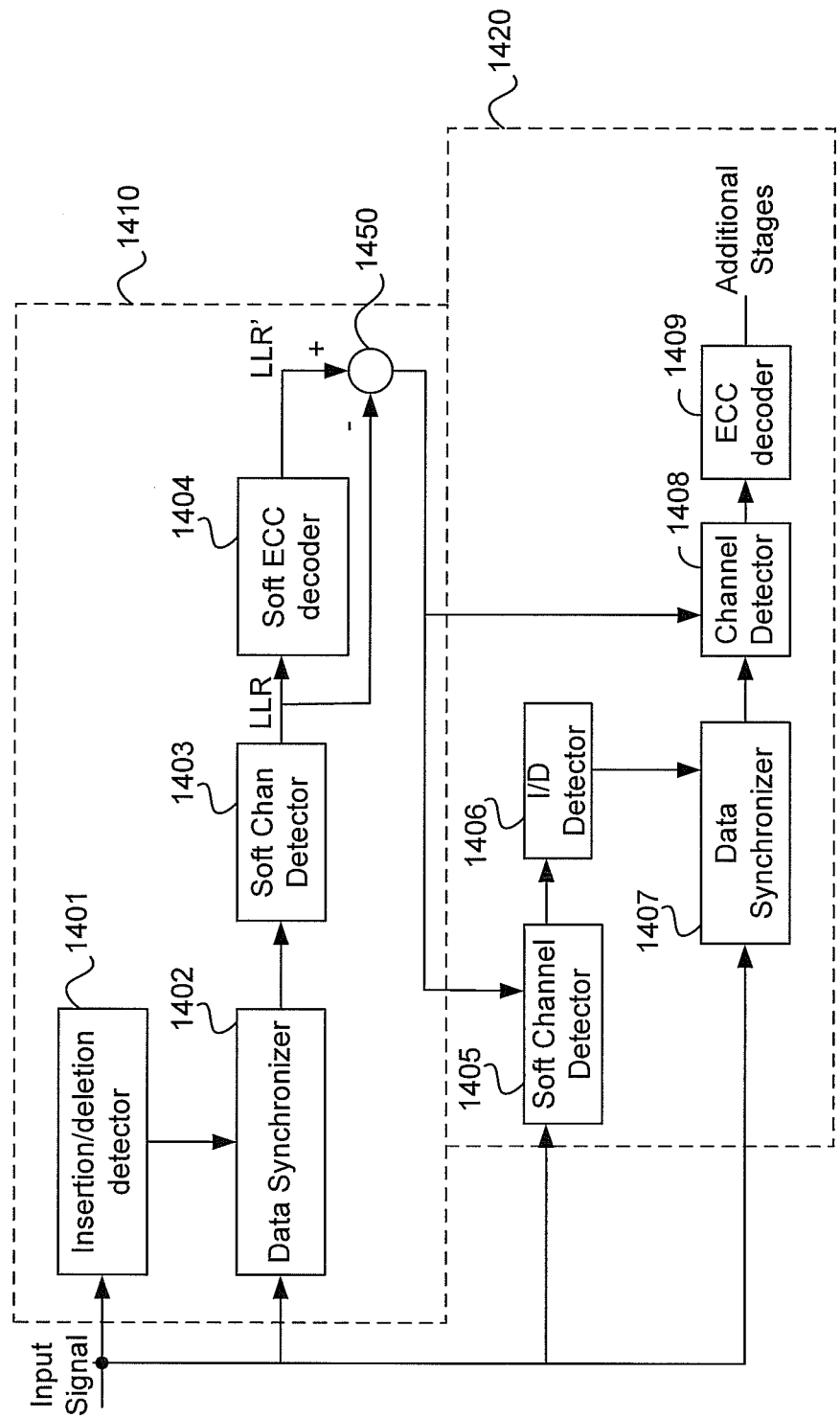
FIG. 14 illustrates an example iterative error correction system using a soft decoder according to another embodiment of the present invention.

FIG. 14 illustrates an iterative error correction system 1400 using a soft decoder according to another embodiment of the present invention. This example illustrates the use of an error correction stage having an insertion/deletion detector with a soft channel decoder. For instance, the input signal is processed by a first error correction stage 1410 including insertion/deletion detector 1401, data synchronizer 1402, soft channel decoder 1403, and a soft ECC decoder 1404. Insertion/deletion detector 1401 and data synchronizer 1402 operate as described above. Soft channel decoder 1403 may be a SOVA or BCJR, for example. Soft channel decoder 1403 receives data samples and outputs log likelihood ratios ("LLRs"). Data errors in the LLRs from soft channel decoder are corrected in soft ECC decoder 1404. Soft ECC decoder 1404 may be an LDPC decoder, for example. The input of the soft ECC decoder 1404 is subtracted from the output of the soft ECC decoder 1404 to generate a difference signal, also referred to as extrinsic information. In this example, the difference signal is used as the reference signal. Extrinsic information represents the improvement in the signal introduced by soft ECC decoder 1404, for example. Since the next error correction stage 1420 receives an LLR difference data signal, a soft channel detector is used in the insertion/deletion detection process. For example, the input signal is first processed by soft channel detector 1405, which may be a SOVA or BCJR. Soft channel detector 1405 has two inputs. The first is data samples, and the second is the difference signal. The output of soft channel detector 1405 is provided as an input to insertion/deletion ("I/D") detector 1406. Insertion/deletion detector 1406 produces a number of insertions/deletions and locations based on both the input signal and the corrected signal from first error correction stage 1410. Insertion/deletion detector 1406 may use a Low Density Parity Check ("LDPC") code to detect insertions or deletions, for example. An example of LDPC insertion deletion detection is illustrated in U.S. patent application Ser. No. 12/540,995, filed Aug. 13, 2009, entitled "Detecting Insertion/Deletion using LDPC Code", naming Panu Chaichanavong, Xueshi Yang, Gregory Burd, and Shumei Song as inventors, the entire disclosure of which is hereby incorporated herein by reference. The output of insertion/deletion detector 1406 is coupled to data synchronizer 1407. The output of data synchronizer 1407 is coupled through a channel detector 1408 and ECC decoder 1409. Channel detector 1408 may be a soft channel detector, and may further receive the difference signal as an input. In another embodiment, channel detector 1408 and ECC decoder 1409 may be different than the channel detector 1403 and ECC decoder 1404 used in the first error correction stage (e.g., channel detector 1408 and ECC decoder 1409 may be hard rather than soft).

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. An error correction method comprising:
   receiving a digital signal;
   processing the digital signal in a first error correction stage to perform a first error correction, the first error correction including a first correction for data insertions or deletions and a first correction of data errors, the processing to generate a reference signal; and
   processing the digital signal in a plurality of subsequent error correction stages to perform additional corrections for the data insertions or deletions and the data errors to generate a plurality of subsequent reference signals, wherein each subsequent error correction stage performs the additional correction for the data insertions or deletions based on the digital signal and a previous reference signal from a previous error correction stage.

2. The method of claim 1 wherein different error correction stages use different correction algorithms to correct for the data insertions or deletions.

3. The method of claim 1 wherein at least one error correction stage uses a soft channel detector to correct for the data insertions or deletions and at least one other stage uses a hard channel detector to correct for the data insertions or deletions.

4. The method of claim 1 wherein one or more reference signals correspond to the digital signal having been corrected.

5. The method of claim 1 wherein at least one reference signal comprises log likelihood ratios.

6. The method of claim 1 wherein at least one reference signal is a difference signal, and wherein the difference signal is generated by subtracting an input to a soft ECC decoder from an output of the soft ECC decoder.

7. The method of claim 6 wherein the difference signal comprises extrinsic information.

8. The method of claim 1 wherein at least one error correction stage performs processing comprising:
- detecting a number and location of the insertions or deletions in the digital signal;
- synchronizing the digital signal using the detected number and location of insertions or deletions to generate a synchronized signal;
- processing the synchronized signal using a first hard channel detector to generate a first binary signal; and
- processing the first binary signal in a hard ECC decoder to generate one of said reference signals, and wherein an error correction stage subsequent to said at least one error correction stage performs processing comprising:
- processing the digital signal with a second hard channel detector to generate a second binary signal; and
- detecting a number and location of insertions or deletions in the second binary signal using said one of said reference signals from the previous stage.

9. The method of claim 8 wherein the first hard channel detector is a Viterbi channel detector.

10. The method of claim 1 wherein
at least one error correction stage performs processing comprising:
- detecting a number and location of the insertions or deletions in the digital signal;
- synchronizing the digital signal using the detected number and location of insertions or deletions to generate a synchronized signal;
- processing the synchronized signal using a first soft channel detector to generate a first signal; and
- processing the first signal in a soft ECC decoder to generate one of said reference signals, and wherein an error correction stage subsequent to said at least one error correction stage performs processing comprising:
- processing the digital signal and said one of said reference signals from the previous stage with a second soft channel detector to generate a second signal; and
- detecting a number and location of the insertions or deletions in the second signal.

11. The method of claim 10 further comprising subtracting the first signal from an output of the soft ECC decoder to generate the reference signal.

12. The method of claim 10 wherein the second soft channel detector is a Viterbi channel detector.

13. An error correction system comprising:
- a first error correction stage to receive a digital signal, the first error correction stage configured to perform a first error correction including a first correction for data insertions or deletions and a first correction of data errors and to generate a reference signal; and
- a plurality of subsequent error correction stages to perform additional corrections for the data insertions or deletions and the data errors and to generate a plurality of subsequent reference signals, wherein each subsequent error correction stage performs the additional correction for data insertions or deletions based on the digital signal and a previous reference signal from a previous error correction stage.

14. The system of claim 13 wherein different error correction stages use different correction algorithms to correct for the data insertions or deletions.

15. The system of claim 13 wherein at least one error correction stage comprises a soft channel detector between the digital signal and a first insertion/deletion detector to correct for the data insertions or deletions and at least one other stage comprises a hard channel detector between the digital signal and a second insertion/deletion detector correct for the data insertions or deletions.

16. The system of claim 13 wherein one or more reference signals correspond to the digital signal having been corrected.

17. The system of claim 13 wherein at least one reference signal comprises log likelihood ratios.

18. The system of claim 13 wherein at least one reference signal is a difference signal, and wherein the difference signal is generated by subtracting an input to a soft ECC decoder from an output of the soft ECC decoder.

19. The system of claim 13 wherein
at least one error correction stage comprises:
- a first insertion/deletion detector to detect a number and location of the insertions or deletions in the digital signal;
- a data synchronizer to synchronize the digital signal using the detected number and location of insertions or deletions and to generate a synchronized signal;
- a first hard channel detector to process the synchronized signal and to generate a first binary signal; and
- a hard ECC decoder to process the first binary signal and to generate one of said reference signals, and wherein an error correction stage subsequent to said at least one error correction stage comprises:
- a second hard channel detector to process the digital signal to generate a second binary signal; and
- a second insertion/deletion detector to detect a number and location of insertions or deletions in the second binary signal using said one of said reference signals from the previous stage.

20. The system of claim 13 wherein at least one error correction stage comprises:
- a first insertion/deletion detector to detect a number and location of the insertions or deletions in the digital signal;
- a data synchronizer to synchronize the digital signal using the detected number and location of insertions or deletions and to generate a synchronized signal;
- a first soft channel detector to process the synchronized signal and to generate a first signal; and
- a soft ECC decoder to process the first signal and to generate one of said reference signals, and wherein an error correction stage subsequent to said at least one error correction stage comprises:
- a second soft channel detector to process the digital signal and said one of said reference signals from the previous stage and to generate a second signal; and a second insertion/deletion detector to detect a number and location of the insertions or deletions in the second signal.

\* \* \* \* \*